US012672316B2

(12) United States Patent
Choi et al.

(10) Patent No.: US 12,672,316 B2
(45) Date of Patent: Jun. 30, 2026

(54) THIN FILM TRANSISTOR AND DISPLAY DEVICE COMPRISING THE SAME

(71) Applicant: LG Display Co., Ltd., Seoul (KR)

(72) Inventors: Sungju Choi, Paju-si (KR); JungSeok Seo, Paju-si (KR); Younghyun Ko, Paju-si (KR); Jaeyoon Park, Paju-si (KR); Seoyeon Im, Paju-si (KR); Jinwon Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 684 days.

(21) Appl. No.: 17/977,864

(22) Filed: Oct. 31, 2022

(65) Prior Publication Data

US 2023/0140193 A1 May 4, 2023

(30) Foreign Application Priority Data

Nov. 2, 2021 (KR) ........................ 10-2021-0148501

(51) Int. Cl.
*H10D 30/67* (2025.01)
*H10D 86/40* (2025.01)
(Continued)

(52) U.S. Cl.
CPC ..... *H10D 30/6757* (2025.01); *H10D 30/6755* (2025.01); *H10D 86/423* (2025.01); *H10D 86/60* (2025.01); *H10K 59/1213* (2023.02)

(58) Field of Classification Search
CPC ............... H10D 30/6757; H10D 86/60; H10D 30/6755; H10D 86/423; H10K 59/1213
See application file for complete search history.

(56) References Cited

U.S. PATENT DOCUMENTS 9,236,495 B2 1/2016 Seo et al.
10,096,715 B2 * 10/2018 Yamazaki .......... H10D 30/6704
(Continued)

FOREIGN PATENT DOCUMENTS

CN 111897168 A 11/2020
CN 112002763 A 11/2020
(Continued)

OTHER PUBLICATIONS

Hwang et al., "Vertical Channel ZnO Thin-Film Transistors Using an Atomic Layer Deposition Method," *IEEE Electron Device Letters* 35(3):360-362, Mar. 2014.
(Continued)

*Primary Examiner* — Jeff W Natalini
*Assistant Examiner* — Andrew John Zabel
(74) *Attorney, Agent, or Firm* — Seed Intellectual Property Law Group LLP

(57) ABSTRACT

A thin film transistor and a display device comprising the same are provided. The thin film transistor comprises an active layer, and a gate electrode at least partially overlapped with the active layer, wherein the active layer includes a channel portion, a first connection portion that is in contact with one side of the channel portion, and a second connection portion that is in contact with the other side of the channel portion, the channel portion includes a first area and a second area that is disposed in parallel with the first area, each of the first area and the second area is extended from the first connection portion to the second connection portion, and an effective gate voltage applied to the first area is smaller than that applied to the second area.

22 Claims, 34 Drawing Sheets

(51) Int. Cl.

| | |
|---|---|
| H10D 86/60 | (2025.01) |
| H10K 59/121 | (2023.01) |

(56) References Cited

U.S. PATENT DOCUMENTS

| | | | | |
|---|---|---|---|---|
| 10,553,690 | B2 * | 2/2020 | Tanaka | H10D 1/692 |
| 11,386,821 | B2 | 7/2022 | Lee | |
| 2005/0258487 | A1 | 11/2005 | Suh et al. | |
| 2006/0270122 | A1 | 11/2006 | Lee et al. | |
| 2009/0189160 | A1 | 7/2009 | Ahn et al. | |
| 2009/0289258 | A1 | 11/2009 | Kim et al. | |
| 2017/0270882 | A1 * | 9/2017 | Mori | G06F 3/0412 |
| 2017/0358682 | A1 * | 12/2017 | Goto | H10D 99/00 |
| 2018/0012538 | A1 * | 1/2018 | Asami | G09G 3/3648 |
| 2018/0151633 | A1 | 5/2018 | Won et al. | |
| 2019/0074377 | A1 | 3/2019 | Park et al. | |
| 2019/0189647 | A1 | 6/2019 | Lee et al. | |
| 2020/0111855 | A1 | 4/2020 | Bae et al. | |
| 2020/0126992 | A1 * | 4/2020 | Yamazaki | H10D 30/6734 |
| 2020/0203534 | A1 * | 6/2020 | Park | H10D 30/6755 |
| 2020/0211425 | A1 * | 7/2020 | Yamazaki | G02F 1/1368 |
| 2021/0126132 | A1 * | 4/2021 | Sato | H10D 30/6757 |
| 2022/0020837 | A1 | 1/2022 | Kim et al. | |
| 2022/0140144 | A1 * | 5/2022 | Yamazaki | H10D 30/6757 |
| | | | | 257/288 |

FOREIGN PATENT DOCUMENTS

| | | | |
|---|---|---|---|
| CN | 112928127 | A | 6/2021 |
| CN | 113054034 | A | 6/2021 |
| CN | 113327935 | A | 8/2021 |
| KR | 100647695 | B1 | 11/2006 |
| KR | 20150142992 | A | 12/2015 |
| KR | 20180050478 | A | 5/2018 |
| KR | 20210042296 | A | 4/2021 |
| KR | 20210086283 | A | 7/2021 |
| WO | WO 2020150895 | A1 | 7/2020 |

OTHER PUBLICATIONS

Kim et al., "Comparative studies on vertical-channel charge-trap memory thin-film transistors using In—Ga—Zn—O active channels deposited by sputtering and atomic layer depositions," *Nanotechnology* 31(435702):1-9, 2020.

* cited by examiner

100

100

300

130(130n)  150

180

140
120
110

3I                                                              3I'

81  Cap31  11    Cap33  82

300

161 CH1    CH2              150    11        CH3 162

180

140
120
110

3II                                                            3II'

85              131    130n    132

130

400

Cap41   150   180   140   120   110
4I   4I'
21   91   22

400

161 CH1   CH2   150   21   CH3 162   180   140   120   110
4II   4II'
95   131   130n   132
130

150(Gate)

140(GI)

130n(CH)

120(BUF)

$C_{GI}$

131(Source)

$C_{CH}$ $V_{GS}$ $C_{GI}$ $V_{eff}$ $C_{CH}$

Source

THIN FILM TRANSISTOR AND DISPLAY DEVICE COMPRISING THE SAME

CROSS-REFERENCE TO RELATED APPLICATIONS

This application claims the benefit of priority of the Korean Patent Application No. 10-2021-0148501 filed on Nov. 2, 2021.

BACKGROUND

Technical Field

The present disclosure relates to a thin film transistor and a display device comprising the same.

Description of the Related Art

Transistors are widely used as switching devices or driving devices in the field of electronic devices. In particular, since a thin film transistor can be fabricated on a glass substrate or a plastic substrate, thin film transistors are widely used as a switching device of display device such as a liquid crystal display device or an organic light emitting device.

The display device may include, for example, a switching thin film transistor and a driving thin film transistor. Generally, it is advantageous that the switching thin film transistor has a small s-factor to improve on-off characteristics and the driving thin film transistor has a large s-factor to represent a gray scale.

BRIEF SUMMARY

In the related art, thin film transistors with a small s-factor are generally chosen to ensure/give rise to higher on-off characteristics. However, when these thin film transistors are applied to a driving thin film transistor of the display device, it is difficult to represent a gray scale of the display device.

Therefore, the thin film transistor having a large s-factor is required to more easily, accurately and efficiently represent a gray scale by being applied to the driving thin film transistor of the display device. Also, even when a thin film transistor has a large s-factor, it is also advantageous that the thin film transistor should have excellent, for example high, current characteristics in an ON-state.

The present disclosure has been made in view of the various technical problems in the related art including the above identified problems. Accordingly, one or more embodiments of the present disclosure provide a thin film transistor that has a large s-factor, and has excellent current characteristics in an ON-state.

One or more embodiments of the present disclosure provide a thin film transistor that has a large s-factor at a threshold voltage period, and has a large current value in an ON-state.

One or more embodiments of the present disclosure provide a thin film transistor designed to have a large s-factor at a threshold voltage period as an 'effective gate voltage' of a first area of a channel portion so that it is lower than that of a second area of the channel portion. The effective gate voltage, contrasting a voltage applied to a gate electrode from an outside power source, is a portion of a voltage applied to the gate electrode which actually causes current to flow.

One or more embodiments of the present disclosure provide a thin film transistor designed such that an interval between a gate electrode and an active layer is not greater than necessary to have excellent/improved ON-current characteristics as the interval between the gate electrode and the active layer does not need to be increased to increase an s-factor of the thin film transistor.

One or more embodiments of the present disclosure provide a thin film transistor in which a spacer is disposed along one direction of a channel portion to have a large s-factor and at the same time have large ON-current characteristics.

One or more embodiments of the present disclosure provide a thin film transistor in which a conductive material layer is disposed along one direction of a channel portion to have a large s-factor and at the same time have large ON-current characteristics.

One or more embodiments of the present disclosure provide a display device that has an excellent gray scale representation capability and excellent current characteristics by including a driving thin film transistor having a large s-factor and large ON-current characteristics.

In addition to the technical benefits of the present disclosure as mentioned above, additional benefits and features of the present disclosure will be clearly understood by those skilled in the art from the following description of the present disclosure.

In accordance with an aspect of the present disclosure, the above and other objects can be accomplished by the provision of a thin film transistor comprising an active layer, and a gate electrode at least partially overlapped with (by) the active layer, wherein the active layer includes a channel portion, a first connection portion that is in contact with one side of the channel portion, and a second connection portion that is in contact with the other side (the opposite side) of the channel portion, wherein the channel portion includes a first area and a second area that is disposed in parallel with the first area, each of the first area and the second area is extended from the first connection portion to the second connection portion, and an effective gate voltage applied to the first area is smaller than that applied to the second area.

The channel portion may include a third area spaced apart from the first area with the second area interposed therebetween, the third area may be extended from at least the first connection portion to the second connection portion, and an effective gate voltage applied to the third area may be smaller than that applied to the second area.

The channel portion includes a fourth area spaced apart from the second area with the first area interposed therebetween, the fourth area may be extended from at least the first connection portion to the second connection portion, and an effective gate voltage applied to the fourth area may be greater than that applied to the first area.

The thin film transistor may further comprise a first conductive material layer overlapped with the channel portion, wherein the channel portion may be disposed between the first conductive material layer and the gate electrode, and the first conductive material layer may be connected to the first connection portion.

The first conductive material layer may overlap the first area.

The thin film transistor may further comprise a first spacer overlapped with the channel portion.

The first spacer may not overlap the first area, and may overlap the second area.

The channel portion may further include a third area spaced apart from the first area so as not to overlap the first spacer.

The first spacer may be disposed between the channel portion and the first conductive material layer.

The first spacer and the first conductive material layer may be disposed on the same layer.

The thin film transistor may further comprise a second spacer spaced apart from the first spacer to overlap the channel portion.

The channel portion may include a fourth area overlapped with the second spacer.

The first area may overlap a gap space (meaning a gap or space) between the first spacer and the second spacer.

The first spacer and the second spacer may be disposed between the channel portion and the first conductive material layer.

The first conductive material layer, the first spacer and the second spacer may be disposed on the same layer, and the first conductive material layer may be disposed between the first spacer and the second spacer.

The thin film transistor may further comprise a second conductive material layer spaced apart from the first conductive material layer to overlap the channel portion, the channel portion may be disposed between the second conductive material layer and the gate electrode, and the second conductive material layer may be connected to the first connection portion.

The channel portion may include a third area overlapped with the second conductive material layer.

The thin film transistor may further comprise a first spacer between the first conductive material layer and the second conductive material layer.

The first conductive material layer, the second conductive material layer and the first spacer may be disposed on the same layer.

The second area may overlap a gap space between the first conductive material layer and the second conductive material layer.

The thin film transistor may further comprise a conductive pattern spaced apart from the active layer with the first conductive material layer interposed therebetween.

The thin film transistor may further comprise a conductive pattern spaced apart from the active layer with the first conductive material layer and the second conductive material layer, which are interposed therebetween.

The active layer may include an oxide semiconductor material.

The oxide semiconductor material may include at least one of an IZO(InZnO)-based semiconductor material, IGO (InGaO)-based semiconductor material, ITO(InSnO)-based semiconductor material, IGZO(InGaZnO)-based semiconductor material, IGZTO(InGaZnSnO)-based semiconductor material, GZTO(GaZnSnO)-based semiconductor material, GZO(GaZnO)-based semiconductor material, ITZO(InSnZnO)-based semiconductor material, or FIZO(FeInZnO)-based oxide semiconductor material. The oxide semiconductor material according to one or more embodiments of the present disclosure does not require to include each and every semiconductor material enumerated above. For example, in one embodiment, the oxide semiconductor material may include only an IZO(InZnO)-based semiconductor material. In another embodiment, the oxide semiconductor material may include only an IGO(InGaO)-based semiconductor material. In yet another embodiment, the oxide semiconductor material may include a combination of the IZO(InZnO)-based semiconductor material and the IGO (InGaO)-based semiconductor material. In another embodiment, the oxide semiconductor material may include a combination of each of the oxide semiconductor material enumerated above. Namely, in the embodiment, the oxide semiconductor material may include a combination of the IZO(InZnO)-based semiconductor material, the IGO(InGaO)-based semiconductor material, the ITO(InSnO)-based semiconductor material, the IGZO(InGaZnO)-based semiconductor material, the IGZTO(InGaZnSnO)-based semiconductor material, the GZTO(GaZnSnO)-based semiconductor material, the GZO(GaZnO)-based semiconductor material, the ITZO(InSnZnO)-based semiconductor material, or the FIZO(FeInZnO)-based oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

In accordance with another aspect of the present disclosure, the above and other objects can be accomplished by the provision of a display device comprising the above-described thin film transistor.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1A:
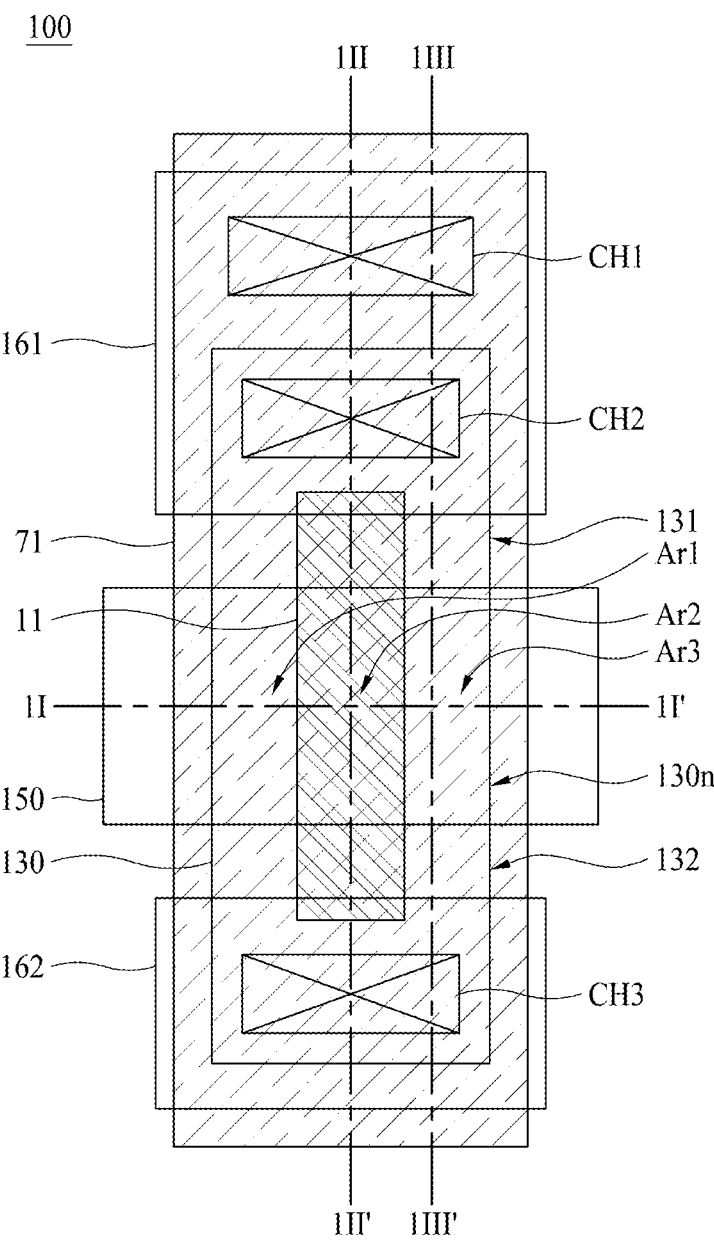
FIG. 1A is a plan view illustrating a thin film transistor according to one embodiment of the present disclosure.

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "overlap", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an example term "below or beneath" may include "below or beneath" and "above" orientations. Likewise, an example term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
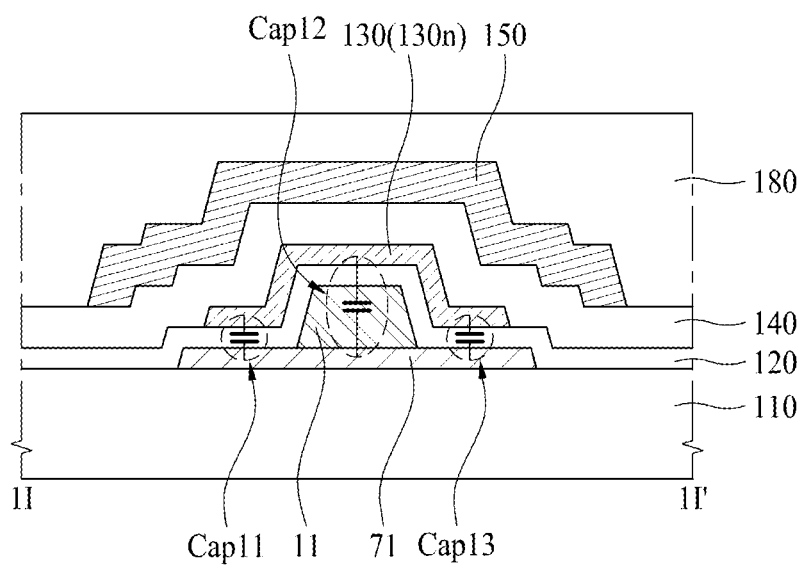
FIGS. 1B, 1C and 1D are cross-sectional views illustrating a thin film transistor according to one embodiment of the present disclosure.
Figure 1C:
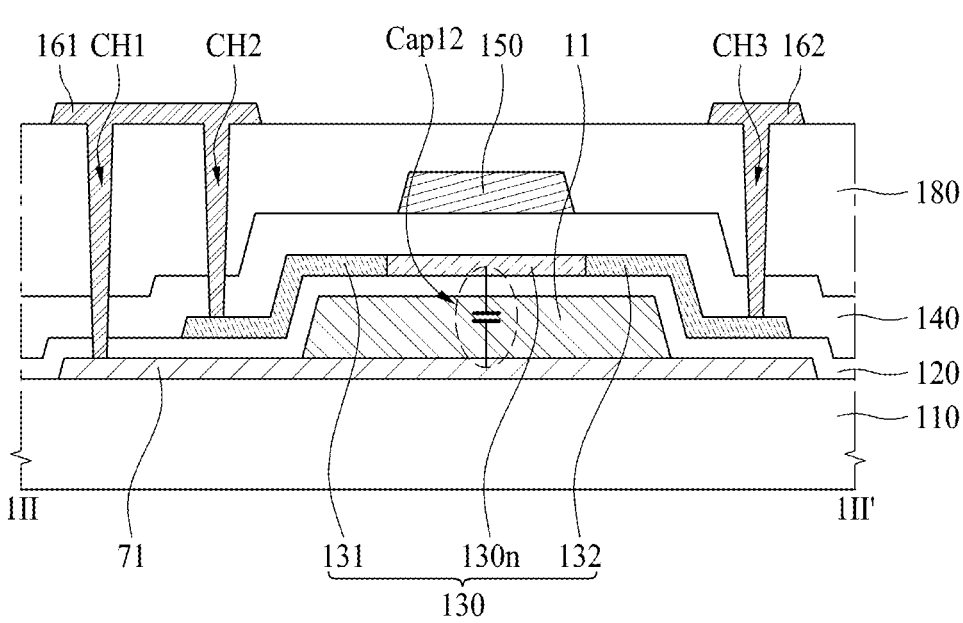
Figure 1D:
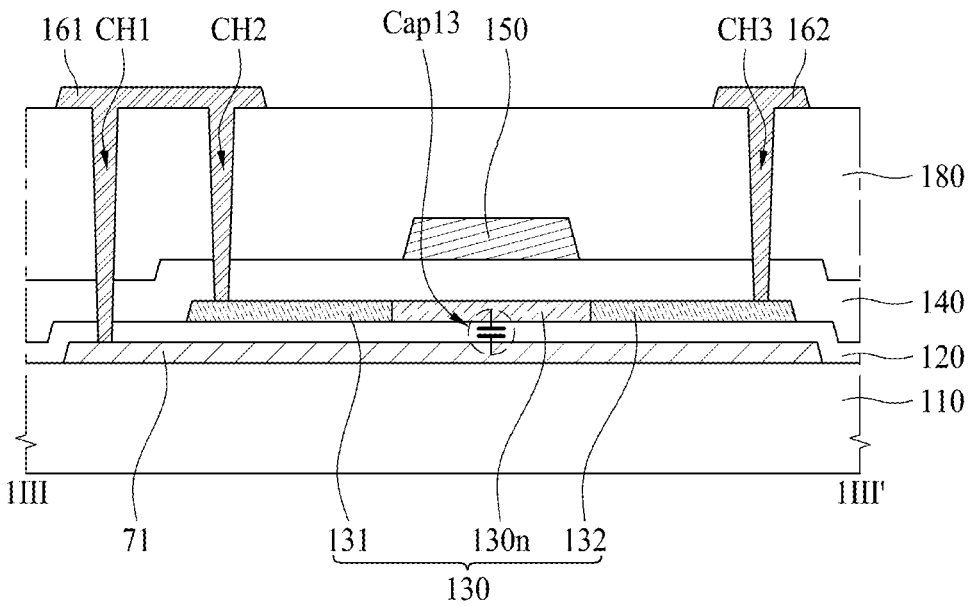

FIG. 1A is a plan view illustrating a thin film transistor 100 according to one embodiment of the present disclosure and FIGS. 1B, 1C and 1D are cross-sectional views illustrating a thin film transistor 100 according to one embodiment of the present disclosure.

The thin film transistor 100 according to one embodiment of the present disclosure includes an active layer 130 and a gate electrode 150 at least partially overlapped with or by the active layer 130. The active layer 130 includes a channel portion 130$n$, a first connection portion 131 that is in contact with one side of the channel portion 130$n$ and a second connection portion 132 that is in contact with the other side of the channel portion 130$n$. According to one embodiment of the present disclosure, the channel portion 130$n$ includes a first area Ar1 and a second area Ar2 disposed in parallel with the first area Ar1, wherein the first area Ar1 and the second area Ar2 are connected from the first connection portion 131 to the second connection portion 132, and an effective gate voltage applied to the first area Ar1 is smaller than that applied to the second area Ar2.

According to one embodiment of the present disclosure, the channel portion 130$n$ includes a third area Ar3 spaced apart from the first area Ar1 with the second area Ar2 interposed therebetween, and an effective gate voltage applied to the third area Ar3 is smaller than that applied to the second area Ar2.

The thin film transistor 100 according to one embodiment of the present disclosure may further include a first conductive material layer 71 overlapped with the channel portion 130$n$, and a first spacer 11 between the channel portion 130$n$ and the first conductive material layer 71. The channel portion 130$n$ is disposed between the first conductive material layer 71 and the gate electrode 150, and the first conductive material layer 71 may be connected to the first connection portion 131.

Hereinafter, the thin film transistor 100 according to one embodiment of the present disclosure will be described in more detail with reference to FIGS. 1A to 1D.

FIG. 1A is a plan view illustrating a thin film transistor 100 according to one embodiment of the present disclosure, FIG. 1B is a cross-sectional view taken along line 1I-1I' of FIG. 1A, FIG. 1C is a cross-sectional view taken along line 1II-1II' of FIG. 1A, and FIG. 1D is a cross-sectional view taken along line 1III-1III' of FIG. 1A.

Referring to FIGS. 1A to 1D, the first conductive material layer 71 is disposed on a substrate 110.

Glass or plastic may be used as the substrate 110. A transparent plastic having a flexible property, for example, polyimide may be used as the plastic. When polyimide is used as the substrate 110, a heat-resistant polyimide capable of enduring a high temperature may be used considering that a high temperature deposition process is performed on the substrate 110.

The first conductive material layer 71 is disposed on the substrate 110. Although not shown in FIGS. 1A to 1D, a lower buffer layer 220 may be disposed between the substrate 110 and the first conductive material layer 71 (see FIGS. 14 and 16). The lower buffer layer 220 may planarize an upper portion of the substrate 110, have air and moisture barrier properties, and may have insulating properties to protect the thin film transistor 100.

The first conductive material layer 71 has electrical conductivity. The first conductive material layer 71 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), titanium (Ti), or iron (Fe). The first conductive material layer 71 may have a multi-layered structure that includes at least two conductive layers having their respective physical properties different from each other.

In addition, the first conductive material layer 71 may have light shielding characteristics. Therefore, the first conductive material layer 71 may serve as a light shielding layer. The first conductive material layer 71 may shield light incident from the outside to protect the channel portion 130$n$. The first conductive material layer 71 may be referred to as the light shielding layer.

The first conductive material layer 71 is disposed between the substrate 110 and the active layer 130, and the first conductive material layer 71 overlaps the channel portion 130$n$ of the active layer 130.

Referring to FIGS. 1A to 1D, the first spacer 11 is disposed on the first conductive material layer 71. The first spacer 11 is disposed between the first conductive material layer 71 and the channel portion 130$n$ to space the first conductive material layer 71 and the channel portion 130$n$ apart from each other.

According to one embodiment of the present disclosure, the first spacer 11 may have a thickness of 1 μm to 10 μm. A thickness of the first spacer 11 may vary depending on a size of the thin film transistor 100. The first spacer 11 may have a thickness of, for example, 10 μm to 20 μm. When the thin film transistor 100 according to one embodiment of the present disclosure is used in the display device, the first spacer 11 may have a thickness of 2 μm to 5 μm, for example. According to one embodiment of the present disclosure, the thickness of the first spacer 11 may be referred to as a distance between both surfaces of the first spacer 11, which is measured along a direction perpendicular to a surface of the substrate 110.

According to one embodiment of the present disclosure, the first spacer 11 may have a thickness of at least two times greater than the buffer layer 120.

The first spacer 11 may be made of an insulating material that includes at least one selected from a silicon oxide, a silicon nitride and a metal-based oxide. The first spacer 11 may have a line shape. For example, a cross-section of the first spacer 11 may have a trapezoidal line shape.

A buffer layer 120 is disposed on the first conductive material layer 71 and the first spacer 11. The buffer layer 120 may include at least one of a silicon oxide, a silicon nitride and a metal-based oxide. According to one embodiment of the present disclosure, the buffer layer 120 may include at least one of silicon oxide or silicon nitride. The buffer layer 120 may have a single layered structure, or and may have a multi-layered structure.

The buffer layer 120 protects the active layer 130. Further, the buffer layer 120 is formed such that the first conductive material layer 71 and the channel portion 130n are spaced apart from and insulated from each other.

The active layer 130 is disposed on the buffer layer 120.

The active layer 130 may be formed of a semiconductor material. The active layer 130 may include any one of an amorphous silicon semiconductor material, a polycrystalline silicon semiconductor material and an oxide semiconductor.

According to one embodiment of the present disclosure, the active layer 130 may include an oxide semiconductor material. The oxide semiconductor material may include, for example, at least one of an IZO(InZnO)-based, IGO(In-GaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based or FIZO(FeIn-ZnO)-based oxide semiconductor material, but one embodiment of the present disclosure is not limited thereto, and an active layer 130 may be made of another oxide semiconductor material known in the art. The oxide semiconductor material according to one or more embodiments of the present disclosure does not require to include each and every semiconductor material enumerated above. For example, in one embodiment, the oxide semiconductor material may include only an IZO(InZnO)-based semiconductor material. In another embodiment, the oxide semiconductor material may include only an IGO(InGaO)-based semiconductor material. In yet another embodiment, the oxide semiconductor material may include a combination of the IZO(InZnO)-based semiconductor material and the IGO(InGaO)-based semiconductor material. In another embodiment, the oxide semiconductor material may include a combination of each of the oxide semiconductor material enumerated above. Namely, in the embodiment, the oxide semiconductor material may include a combination of the IZO(InZnO)-based semiconductor material, the IGO(InGaO)-based semiconductor material, the ITO(InSnO)-based semiconductor material, the IGZO(InGaZnO)-based semiconductor material, the IGZTO(InGaZnSnO)-based semiconductor material, the GZTO(GaZnSnO)-based semiconductor material, the GZO (GaZnO)-based semiconductor material, the ITZO(In-SnZnO)-based semiconductor material, or the FIZO(FeIn-ZnO)-based oxide semiconductor material.

The active layer 130 includes a channel portion 130n, a first connection portion 131 and a second connection portion 132. One side of the channel portion 130n is in contact with the first connection portion 131, and the other side of the channel portion 130n is in contact with the second connection portion 132. The channel portion 130n overlaps the gate electrode 150, and serves as a channel of the thin film transistor 100.

The first connection portion 131 and the second connection portion 132 of the active layer 130 do not overlap the gate electrode 150. The first connection portion 131 and the second connection portion 132 may be formed by selective conductorization of the semiconductor material (where conductorization is a process whereby layers A and B say take oxygen from a part of a first active layer say in contact with a conductive material layer so that oxygen vacancy occurs in the portions of an active layer in contact with the layers A and B, and thus portions of the active layer on contact with the conductive material layer become "conductorized").

According to one embodiment of the present disclosure, the first connection portion 131 of the active layer 130 may be a source area, and the second connection portion 132 may be a drain area. According to one embodiment of the present disclosure, the first connection portion 131 may be referred to as a source electrode, and the second connection portion 132 may be referred to as a drain electrode.

However, one embodiment of the present disclosure is not limited to the above example. The first connection portion 131 may be a drain area, and the second connection portion 132 may be a source area. Also, the first connection portion 131 may be referred to as a drain electrode, and the second connection portion 132 may be referred to as a source electrode.

According to one embodiment of the present disclosure, the channel portion 130n includes a first area Ar1 and a second area Ar2 disposed in parallel with the first area Ar1. Referring to FIGS. 1A and 1B, the first spacer 11 does not overlap the first area Ar1, and overlaps the second area Ar2. According to one embodiment of the present disclosure, an area of the channel portion 130n, which overlaps the first spacer 11, may be referred to as the second area Ar2, and one of the areas of the channel portion 130n, which are partitioned by the first spacer 11 and do not overlap the first spacer 11, may be referred to as the first area Ar1.

Referring to FIGS. 1A and 1B, the channel portion 130n includes a third area Ar3. The third area Ar3 does not overlap the first spacer 11. The third area Ar3 is spaced apart from the first area Ar1 with the second area Ar2 interposed therebetween.

Referring to FIGS. 1A and 1B, the first and second areas Ar1 and Ar2 are disposed in parallel with each other and extended from the first connection portion 131 to the second connection portion 132. The third area Ar3 is also disposed in parallel with the second area Ar2 and extended from the first connection portion 131 to the second connection portion 132.

According to one embodiment of the present disclosure, the effective gate voltage applied to the first area Ar1 is smaller than that applied to the second area Ar2. Also, the effective gate voltage applied to the third area Ar3 is smaller than that applied to the second area Ar2. The effective gate voltage will be described later.

A gate insulating layer 140 is disposed on the active layer 130. The gate insulating layer 140 may include at least one of a silicon oxide, a silicon nitride or a metal-based oxide. The gate insulating layer 140 may have a single layered structure, or may have a multi-layered structure.

Referring to FIGS. 1B to 2D, the gate insulating layer 140 may be integrally formed on the entire surface of the substrate 110 without being patterned, but one embodiment of the present disclosure is not limited thereto. The gate insulating layer 140 may be patterned. For example, the gate insulating layer 140 may be patterned in a shape corresponding to the gate electrode 150.

The gate insulating layer 140 protects the channel portion 130n.

A gate electrode 150 is disposed on the gate insulating layer 140. The gate electrode 150 overlaps the channel portion 130n of the active layer 130.

The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 150 may have a multi-layered structure that includes at least two conductive layers having their respective physical properties different from each other.

An interlayer insulating layer 180 is disposed on the gate electrode 150. The interlayer insulating layer 180 is an insulating layer made of an insulating material. The interlayer insulating layer 180 may be made of an organic material, may be made of an inorganic material, or may be made of a stacked body of an organic layer and an inorganic layer.

A source electrode 161 and a drain electrode 162 are disposed on the interlayer insulating layer 180.

The source electrode 161 may be connected to the first conductive material layer 71 through a contact hole CH1. The source electrode 161 is also connected to the active layer 130 through a contact hole CH2. In detail, the source electrode 161 may be electrically connected to the first connection portion 131 of the active layer 130 through the contact hole CH2. As a result, the first conductive material layer 71 may be connected to the first connection portion 131 of the active layer 130.

The drain electrode 162 is spaced apart from the source electrode 161 and thus connected to the active layer 130 through a contact hole CH3. In detail, the drain electrode 162 may be electrically connected to the second connection portion 132 of the active layer 130 through the contact hole CH3.

Each of the source electrode 161 and the drain electrode 162 may include at least one of molybdenum (Mo), aluminum (Al), chromium (Cr), gold (Au), titanium (Ti), nickel (Ni), neodymium (Nd), copper (Cu) or their alloy. Each of the source electrode 161 and the drain electrode 162 may be formed of a single layer made of metal or a metal alloy, or may be formed of two or more layers.

Referring to FIGS. 1C and 1D, the first connection portion 131 and the source electrode 161 are shown as being distinguished from each other, but one embodiment of the present disclosure is not limited thereto. The first connection portion 131 may be a source electrode, and an electrode represented by the reference numeral "161" may be a connection electrode or a bridge.

Referring to FIGS. 1C and 1D, the second connection 132 and the drain electrode 162 are illustrated as being distinguished from each other, but one embodiment of the present disclosure is not limited thereto and the second connection portion 132 may be a drain electrode, and an electrode represented by the reference numeral "162" may be a connection electrode or a bridge.

According to one embodiment of the present disclosure, since the first conductive material layer 71 is connected to the source electrode 161, the same voltage as that of the source electrode 161 may be applied to the first conductive material layer 71. Since the first conductive material layer 71 is disposed between the substrate 110 and the active layer 130, the voltage applied to the first conductive material layer 71 may affect the channel portion 130n.

For example, due to an electrical influence by the first conductive material layer 71, an electric field effect applied to the channel portion 130n by the gate electrode 150 may be selectively reduced. In detail, an electric field is applied to the channel portion 130n by the gate electrode 150, and the electric field effect applied to the second area of the channel portion 130n may be selectively reduced due to the electrical influence by the first conductive material layer 71.

According to one embodiment of the present disclosure, an effective gate voltage $V_{eff}$ may be reduced in the first area Ar1 of the channel portion 130n, which is disposed to be close to the first conductive material layer 71. As a result, the effective gate voltage $V_{eff}$ applied to the first area Ar1 of the channel portion 130n may be smaller than that applied to the second area Ar2 of the channel portion 130n, which is disposed to be far away from the first conductive material layer 71.

Likewise, the effective gate voltage $V_{eff}$ may be reduced in the third area Ar3 of the channel portion 130n, which is disposed to be close to the first conductive material layer 71. As a result, the effective gate voltage $V_{eff}$ applied to the third area Ar3 of the channel portion 130n may be smaller than that applied to the second area Ar2 disposed to be far away from the first conductive material layer 71.

As described above, when the effective gate voltage is reduced in the channel portion 130n, an s-factor of the thin film transistor 100 may be increased.

Hereinafter, the s-factor will be described in detail.

In a drain-source current graph for a gate voltage of the thin film transistor 100, the s-factor (sub-threshold swing) is obtained by an inverse value of a slope of the graph "at a period of", that is, at a threshold voltage Vth. For example, at the period of/for the threshold voltage Vth of the thin film transistor 100, the s-factor may be used as an index indicating a change level, i.e., a rate of change of the drain-source current with respect to the gate voltage.

When the s-factor becomes large, a 'change rate' or rate of change of a drain-source current $I_{DS}$ for (with respect to) the gate voltage becomes slow.

Figure 11:
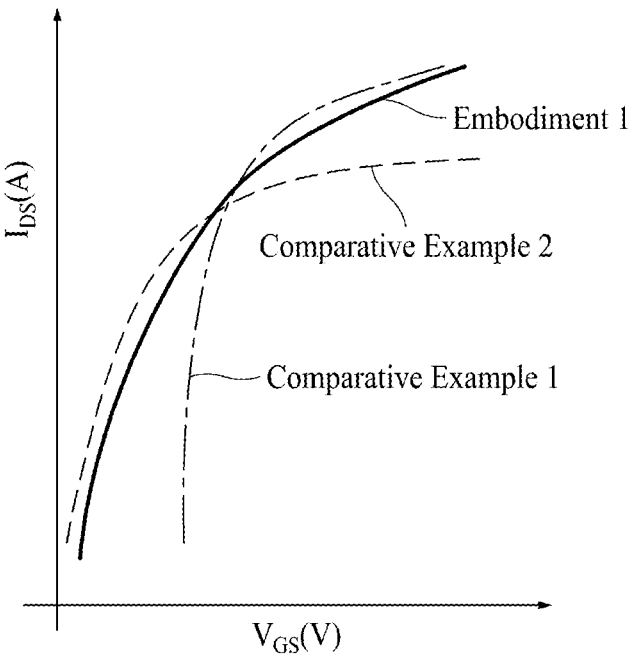
FIG. 11 is a graph illustrating threshold voltages of thin film transistors.

The s-factor may be described by a current-change graph shown in FIG. 11, for example. FIG. 11 is a threshold voltage graph for the thin film transistors. In detail, FIG. 11 illustrates a drain-source current $I_{DS}$ for a gate voltage $V_{GS}$. At the period of the threshold voltage Vth, that is, for Vth, of the graph shown in FIG. 11, an inverse number or gradient of a slope (reciprocal) in the graph of the drain-source current $I_{DS}$ for the gate voltage $V_{GS}$ is the s-factor. When the slope of the graph is sharp, the s-factor is small, and when the slope of the graph is gentle, the s-factor is large. When the s-factor is large, a change rate of the drain-source current $I_{DS}$ for the gate voltage at the period of the threshold voltage Vth is slow.

When the s-factor becomes large, since the change rate of the drain-source current $I_{DS}$ for the gate voltage at the period of the threshold voltage Vth becomes slow, it is easy to adjust a magnitude of the drain-source current $I_{DS}$ by adjusting the gate voltage $V_{GS}$.

In the display device driven by the current, for example, in an organic light emitting display device, a gray scale of a pixel may be controlled by adjusting the magnitude of the drain-source current $I_{DS}$ of the driving thin film transistor. The magnitude of the drain-source current $I_{DS}$ of the driving thin film transistor is determined by the gate voltage. Therefore, in the organic light emitting display device driven by the current, it is easy to adjust a gray scale of a pixel as the s-factor of the driving thin film transistor TR becomes large.

Referring to FIG. 1B, since the first area Ar1 and the third area Ar3 of the channel portion 130n are disposed to be adjacent to the first conductive material layer 71, the first conductive material layer 71 may electrically affect the second area of the channel portion 130n when the same voltage as that of the source electrode 161 is applied to the first conductive material layer 71. Due to the electrical influence of the first conductive material layer 71, the electric field effect applied to the second area of the channel portion 130n by the gate electrode 150 may be reduced. As a result, the s-factor of the thin film transistor 100 that includes the first conductive material layer 71 may be increased.

The influence of the first conductive material layer 71 on the s-factor of the thin film transistor 100 may be described by FIGS. 9A, 9B, 10A and 10B.

Figure 9A:
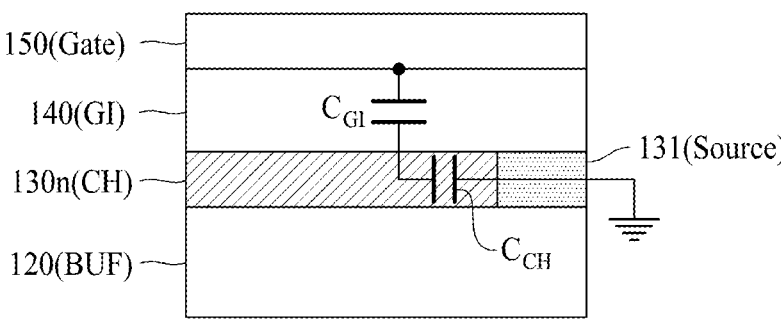
FIGS. 9A and 9B are schematic views illustrating an effective gate voltage of a thin film transistor.
Figure 9B:
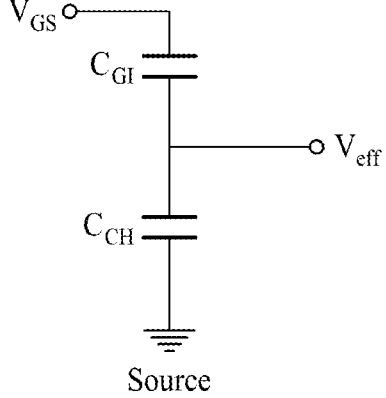

FIGS. 9A and 9B are schematic views illustrating an effective gate voltage $V_{eff}$ of a thin film transistor. In detail, FIGS. 9A and 9B are schematic views illustrating an effective gate voltage $V^{eff}$ of a thin film transistor (Comparative Example 1) that has a structure similar to that of FIGS. 1A to 1D but does not have the first conductive material layer 71.

FIG. 9A schematically illustrates a capacitance Cap that may be generated when a gate voltage $V_{GS}$ is applied to the thin film transistor. The gate voltage $V_{GS}$ is a voltage between the source electrode 161 and the gate electrode 150. According to one embodiment of the present disclosure, the gate voltage $V_{GS}$ may be referred to as a voltage between the first connection portion 131 and the gate electrode 150.

FIG. 9A schematically illustrates a relation between the threshold voltage Vth and the capacitance Cap in the vicinity of the threshold voltage Vth before the thin film transistor is completely turned on.

As shown in FIG. 9A, when the gate voltage $V_{GS}$ is applied to the thin film transistor (Comparative Example 1) that does not have the first conductive material layer 71, a capacitance $C_{GI}$ may be formed between the channel portion 130$n$ of the active layer 130 and the gate electrode 150 (Gate), and a capacitance $C_{CH}$ may be also formed between the channel portion 130$n$ and the first connection portion 131 (Source).

The capacitance $C_{CH}$ formed between the channel portion 130$n$ and the first connection portion 131 (Source) may be referred to as a capacitance formed by a voltage difference between the drain electrode 162, which is a high voltage terminal, and the source electrode 161, which is a low voltage terminal, in the channel portion 130$n$ made of an oxide semiconductor layer having N-type semiconductor characteristics.

The relation between the capacitance Cap and the voltage of FIG. 9A may be represented as shown in FIG. 9B. Referring to FIG. 9B, due to the capacitance $C_{CH}$ between the channel portion 130$n$ and the second connection portion 132 (Source), not all gate voltages $V_{GS}$ are effectively applied to the channel portion 130$n$. As a result, voltage loss may be generated.

Referring to FIG. 9B, when a portion of the gate voltages $V_{GS}$, which is effectively applied to the channel portion 130$n$ during driving of the thin film transistor is referred to as the effective gate voltage $V_{eff}$, the effective gate voltage $V_{eff}$ may be obtained by the following Equation 1.

$$V_{eff}=[C_{GI}/(C_{GI}/C_{CH})]\times V_{GS} \qquad \text{[Equation 1]}$$

Figure 10A:
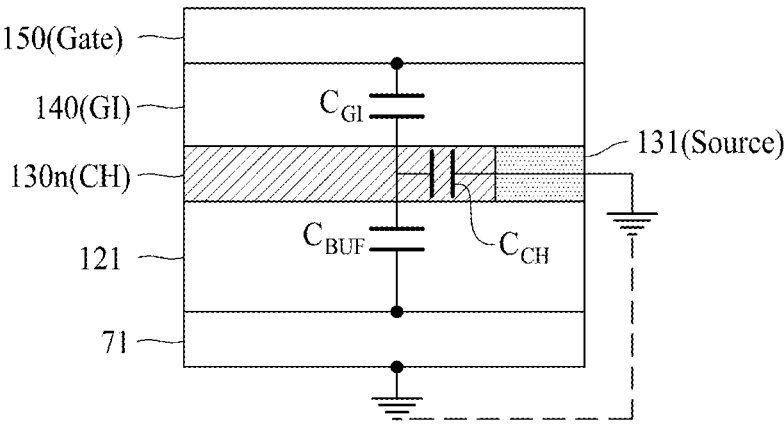
FIGS. 10A and 10B are schematic views illustrating an effective gate voltage of a thin film transistor according to one embodiment of the present disclosure.
Figure 10B:
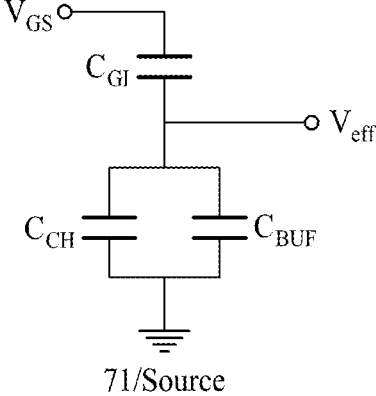

FIGS. 10A and 10B are schematic views illustrating the effective gate voltage $V_{eff}$ of the thin film transistor 100 according to one embodiment of the present disclosure.

FIG. 10A schematically illustrates a capacitance Cap that may be generated when a gate voltage $V_{GS}$ is applied to the thin film transistor 100 according to one embodiment of the present disclosure. FIG. 10A schematically illustrates a relation between the threshold voltage Vth and the capacitance Cap in the vicinity of the threshold voltage Vth before the thin film transistor is completely turned on.

As shown in FIG. 10A, when the gate voltage $V_{GS}$ is applied to the thin film transistor 100, a capacitance $C_{GI}$ may be formed between the channel portion 130$n$ of the active layer 130 and the gate electrode 150, a capacitance $C_{CH}$ may be formed between the channel portion 130$n$ and the first connection portion 131 (Source), and a capacitance $C_{BUF}$ may be additionally formed between the channel portion 130$n$ and the first conductive material layer 71.

Referring to FIGS. 1A and 1B, the capacitance $C_{BUF}$ between the channel portion 130$n$ and the first conductive material layer 71 may be a sum of a first capacitance Cap11 between the first area Ar1 of the channel portion 130$n$ and the first conductive material layer 71, a second capacitance Cap12 between the second area Ar2 of the channel portion 130$n$ and the first conductive material layer 71 and a third capacitance Cap13 between the third area Ar3 of the channel portion 130$n$ and the first conductive material layer 71. In detail, the capacitance $C_{BUF}$ between the channel portion 130$n$ and the first conductive material layer 71 may be calculated by the following Equation 2.

$$C_{BUF}=\text{Cap11}+\text{Cap12}+\text{Cap13} \qquad \text{[Equation 2]}$$

According to one embodiment of the present disclosure, since a distance between the first area Ar1 of the channel portion 130$n$ and the first conductive material layer 71 and a distance between the third area Ar3 and the first conductive material layer 71 is shorter than a distance between the second area Ar2 of the channel portion 130$n$ and the first conductive material layer 71, the following relational Equations 3 and 4 may be established among the first capacitance Cap11, the second capacitance Cap12 and the third capacitance Cap13.

$$\text{Cap11}>\text{Cap12} \qquad \text{[Equation 3]}$$

$$\text{Cap13}>\text{Cap12} \qquad \text{[Equation 4]}$$

The relation between the capacitance Cap and the voltage according to FIG. 10A may be represented as shown in FIG. 10B. Referring to FIG. 10B, due to the capacitance $C_{CH}$ between the channel portion 130$n$ and the first connection portion 131 (Source) and the capacitance $C_{BUF}$ between the channel portion 130$n$ and the first conductive material layer 71, not all gate voltages $V_{GS}$ are effectively applied to the channel portion 130$n$, and voltage loss may be generated.

Since the first conductive material layer 71, the source electrode 161 and the first connection portion 131 are electrically connected to one another, the capacitance $C_{BUF}$ is additionally generated between the channel portion 130$n$ and the first conductive material layer 71, whereby lower capacitance $C_{CH}+C_{BUF}$, which causes voltage loss, is increased.

In detail, when a voltage effectively applied to the channel portion 130$n$ of the gate voltage $V_{GS}$ is referred to as an effective gate voltage $V_{eff}$ in FIG. 10B, the effective gate voltage $V_{eff}$ may be obtained by the following Equation 5.

$$V_{eff}=[C_{GI}/(C_{GI}/C_{CH}C_{BUF})]\times V_{GS} \qquad \text{[Equation 5]}$$

Referring to the Equation 5, since a denominator portion of the Equation 5 is increased due to the capacitance $C_{BUF}$ between the channel portion 130$n$ and the first conductive material layer 171, the effective gate voltage $V_{eff}$ may be relatively reduced to be greater than the Equation 1. Therefore, when the gate voltage $V_{GS}$ is applied, an increasing speed (that is, increasing rate or increasing slope relative to the change of gate voltage) of the drain-source current $I_{DS}$ is reduced in the thin film transistor 100 according to one embodiment of the present disclosure, and as a result, the s-factor is increased.

According to one embodiment of the present disclosure, the capacitance Cap11 between the first area Ar1 of the channel portion 130$n$ and the first conductive material layer 71 is greater than the capacitance Cap12 between the second area Ar2 of the channel portion 130$n$ and the first conductive material layer 71. Also, the capacitance Cap13 between the third area Ar3 of the channel portion 130$n$ and the first conductive material layer 71 is greater than the capacitance Cap12 between the second area Ar2 of the channel portion 130$n$ and the first conductive material layer 71. As a result, the effective gate voltage $V_{eff}$ may be remarkably reduced in the first area Ar1 and the third area Ar3 of the channel portion 130n, which are positioned near the first conductive material layer 71.

Therefore, according to one embodiment of the present disclosure, a magnitude of the effective gate voltage $V_{eff}$ applied to the first area Ar1 is smaller than that of the effective gate voltage $V_{eff}$ applied to the second area Ar2. In addition, a magnitude of the effective gate voltage $V_{eff}$ applied to the third area Ar3 is smaller than that of the effective gate voltage $V_{eff}$ applied to the second area Ar2.

Since the effective gate voltage $V_{eff}$ in the first area Ar1 and the third area Ar3 is relatively small, the increasing speed of the current $I_{DS}$ is delayed/small at the period of the threshold voltage Vth before the thin film transistor 100 is completely turned on, whereby the s-factor is increased. As described above, according to one embodiment of the present disclosure, the s-factor of the thin film transistor 100 may be increased without increase of the interval between the channel portion 130n and the gate electrode 150.

In the state that the thin film transistor 100 is turned on, the capacitance $C_{CH}$ between the channel portion 130n and the first connection portion 131 (Source) and the capacitance $C_{BUF}$ between the channel portion 130n and the first conductive material layer 71 may be disregarded, and the current $I_{DS}$ flows between the drain electrode 162 and the source electrode 161 by the capacitance $C_{GI}$ between the channel portion 130n and the gate electrode 150. According to one embodiment of the present disclosure, since the interval between the channel portion 130n and the gate electrode 150 is not increased, an ON-current of the thin film transistor 100 is not reduced in a state that the thin film transistor 100 is turned on. In the ON-state of the thin film transistor 100, in particular, the second area Ar2 of the channel portion 130n becomes a main current area, so that the ON-current of the thin film transistor 100 may be improved.

In a method of increasing a distance between a gate electrode and a channel portion was applied to increase the s-factor, a problem occurs in that the s-factor is increased but the ON-current of the thin film transistor is reduced.

On the other hand, according to one embodiment of the present disclosure, the s-factor of the thin film transistor 100 may be increased, and the thin film transistor 100 may have excellent/high ON-current characteristics. Since the thin film transistor 100 according to one embodiment of the present disclosure has a large s-factor, the thin film transistor 100 may be used as a driving transistor of the display device.

Figure 1E:
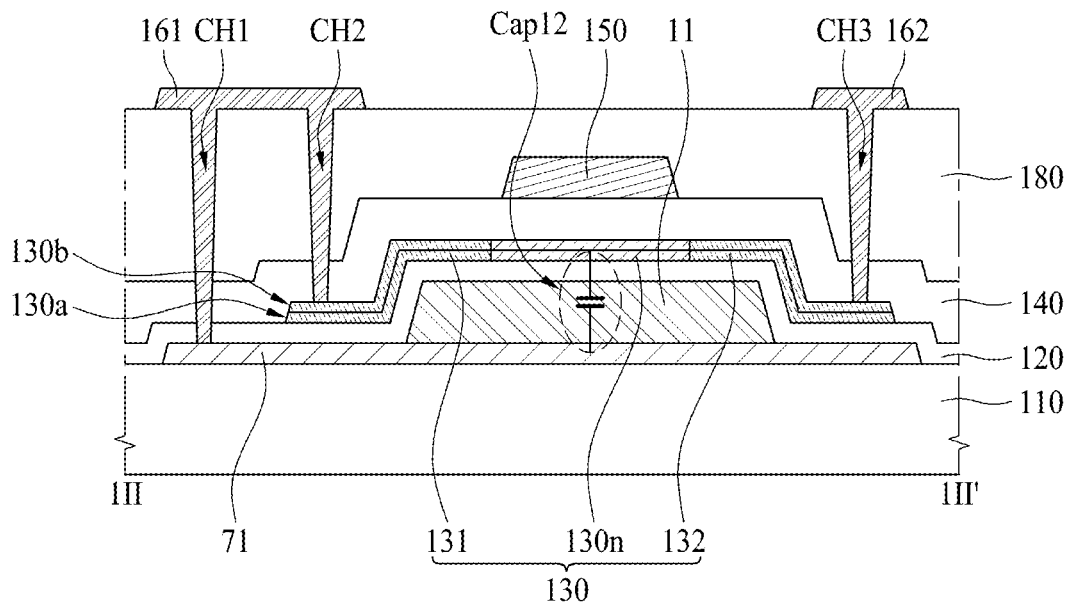
FIGS. 1E and 1F are cross-sectional views illustrating a thin film transistor according to another embodiment of the present disclosure.
Figure 1F:
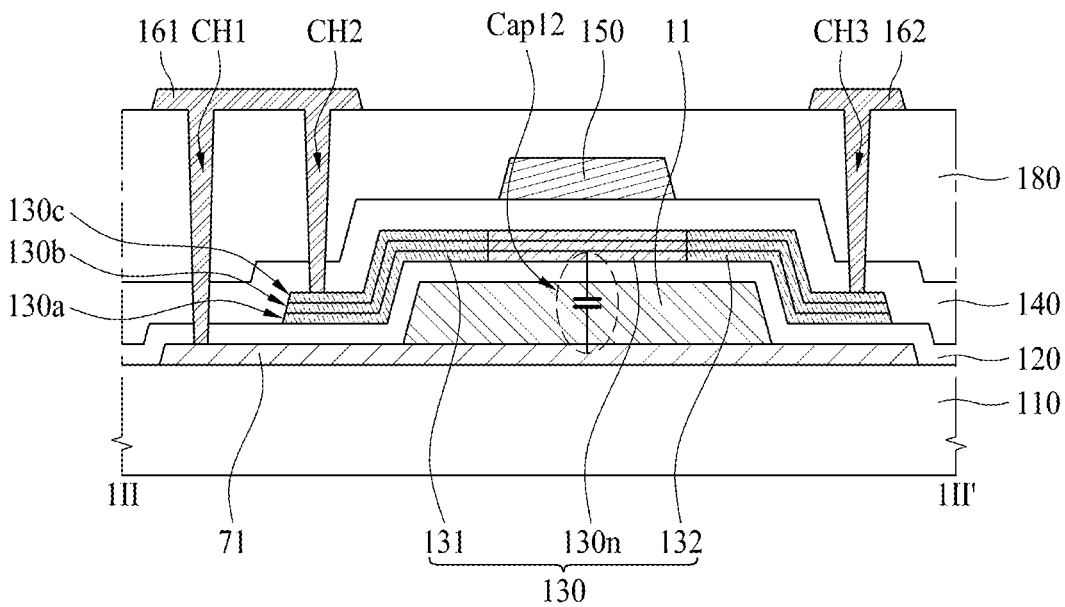

FIGS. 1E and 1F are cross-sectional views illustrating a thin film transistor according to other embodiments of the present disclosure.

In the thin film transistor of FIG. 1E, the active layer 130 has a multi-layered structure in comparison with the thin film transistor 100 of FIGS. 1A to 1D.

Referring to FIG. 1E, the active layer 130 includes a first oxide semiconductor layer 130a on the substrate 110 and a second oxide semiconductor layer 130b on the first oxide semiconductor layer 130a. The first oxide semiconductor layer 130a and the second oxide semiconductor layer 130b may include the same semiconductor material, or may include their respective semiconductor materials different from each other.

The first oxide semiconductor layer 130a supports the second oxide semiconductor layer 130b. Therefore, the first oxide semiconductor layer 130a is referred to as a "support layer". The channel portion 130n may be formed in the second oxide semiconductor layer 130b. Therefore, the second oxide semiconductor layer 130b is referred to as a "channel layer", but one embodiment of the present disclosure is not limited thereto, and the channel portion 130n may be formed in the first oxide semiconductor layer 130a.

A structure in which the active layer 130 includes a first oxide semiconductor layer 130a and a second oxide semiconductor layer 130b is referred to as a bi-layer structure.

In the thin film transistor of FIG. 1F, the active layer further includes a third oxide semiconductor layer 130c on the second oxide semiconductor layer 130b, in comparison with the thin film transistor of FIG. 1E.

Referring to FIG. 1F, the active layer 130 includes a first oxide semiconductor layer 130a, a second oxide semiconductor layer 130b and a third oxide semiconductor layer 130c, but another embodiment of the present disclosure is not limited thereto, and the active layer 130 may further include another semiconductor layer.

Figure 2A:
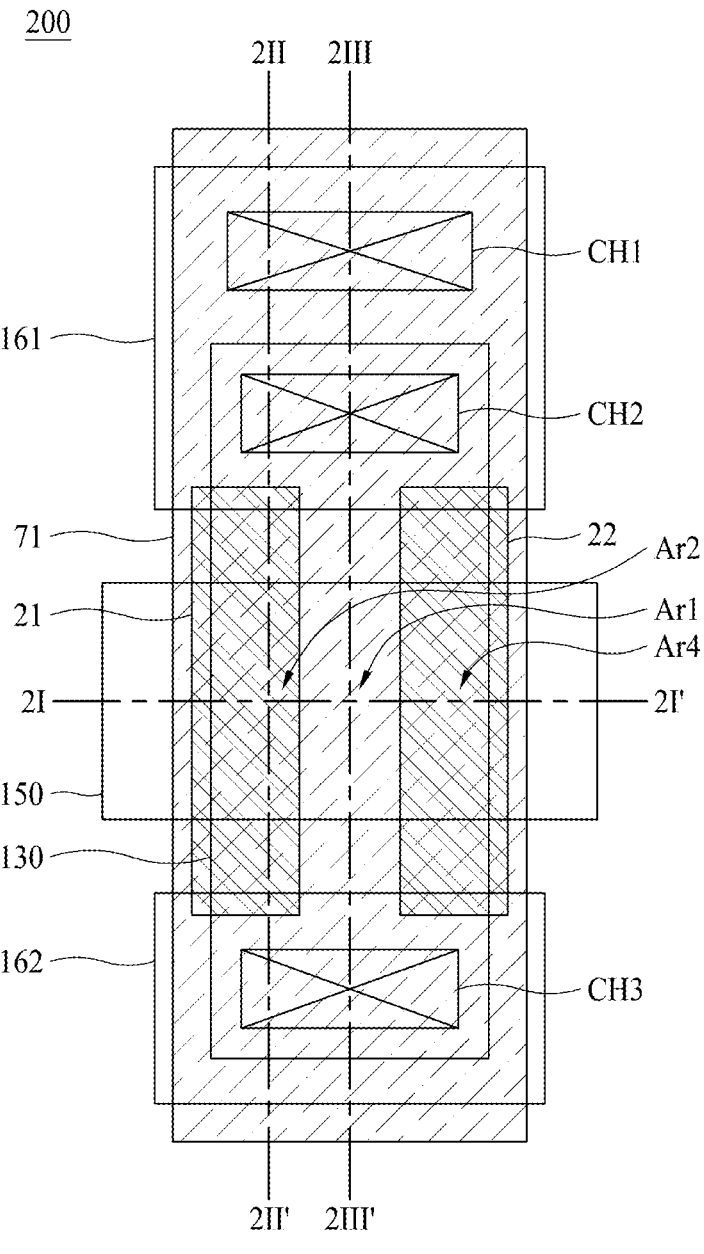
FIG. 2A is a plan view illustrating a thin film transistor according to another embodiment of the present disclosure.
Figure 2B:
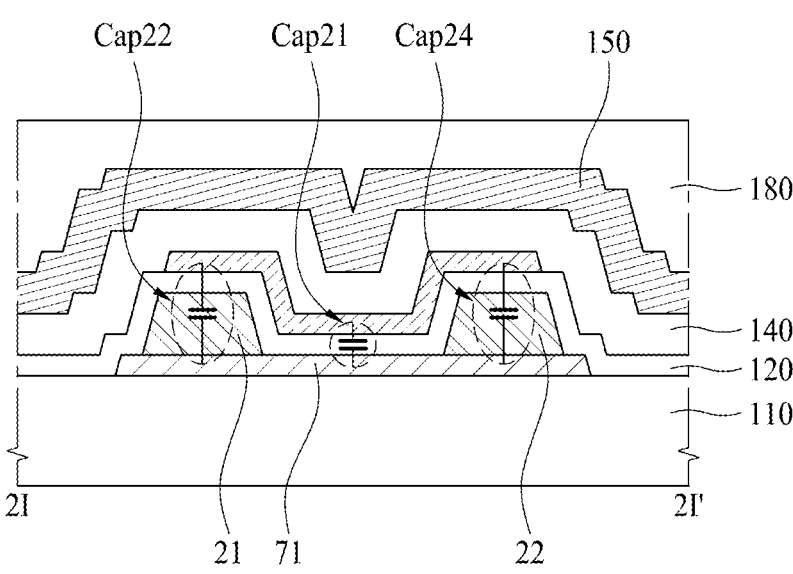
FIGS. 2B, 2C and 2D are cross-sectional views illustrating a thin film transistor according to another embodiment of the present disclosure.
Figure 2C:
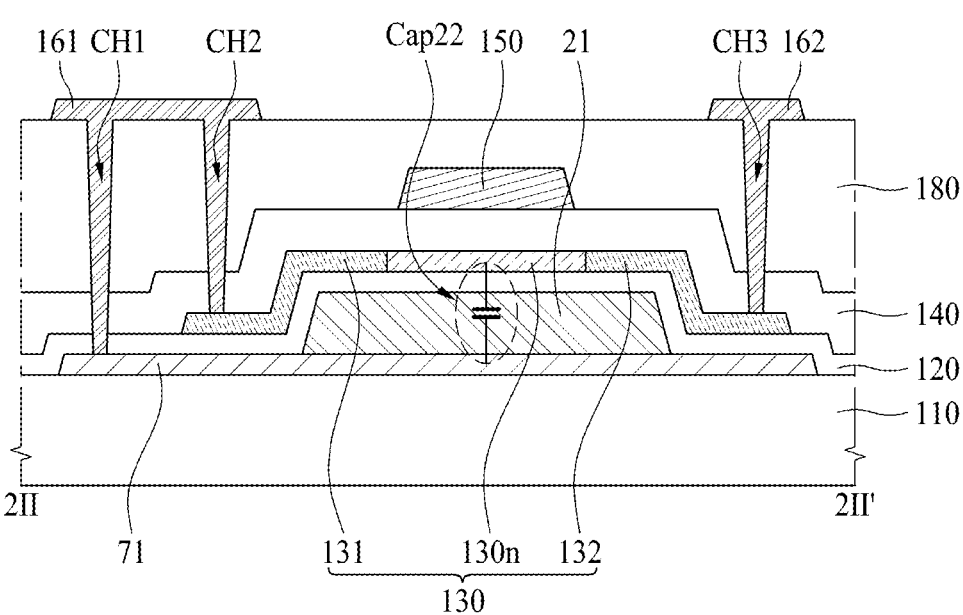
Figure 2D:
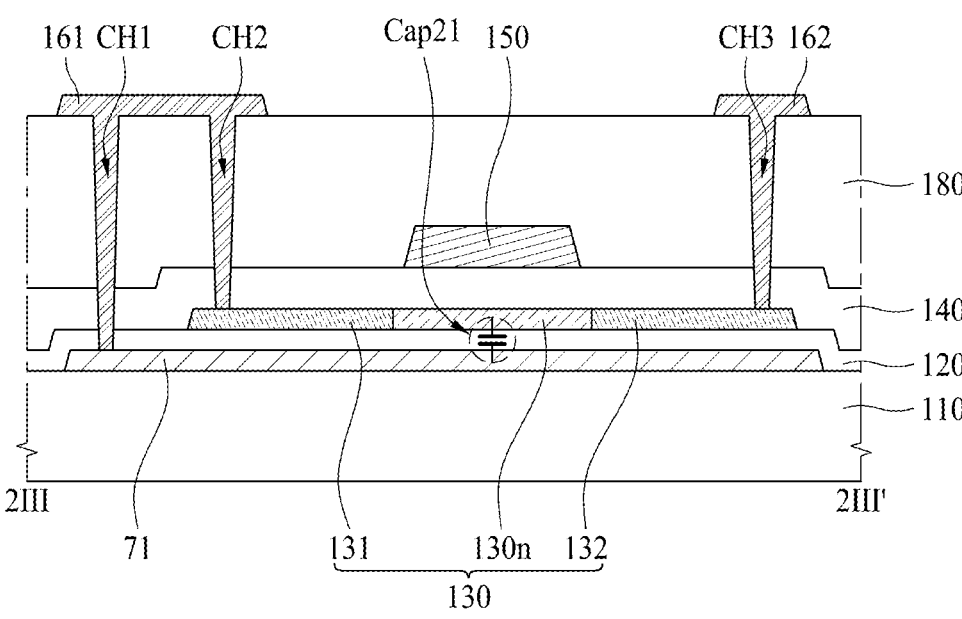

FIG. 2A is a plan view illustrating a thin film transistor 200 according to another embodiment of the present disclosure, and FIGS. 2B, 2C and 2D are cross-sectional views illustrating a thin film transistor 200 according to another embodiment of the present disclosure. In detail, FIG. 2B is a cross-sectional view taken along line 2I-2I' of FIG. 2A, FIG. 2C is a cross-sectional view taken along line 2II-2II' of FIG. 2A, and FIG. 2D is a cross-sectional view taken along line 2III-2III' of FIG. 2A.

The thin film transistor 200 of FIG. 2A includes a first spacer 21 and a second spacer 22 in comparison with the thin film transistor 100 of FIG. 1A. Hereinafter, the description of the elements that are already described will be omitted in order to avoid redundancy.

Referring to FIGS. 2A and 2B, the first spacer 21 and the second spacer 22 are disposed on the first conductive material layer 71. The first spacer 21 and the second spacer 22 are disposed between the first conductive material layer 71 and the channel portion 130n to space the first conductive material layer 71 and the channel portion 130n apart from each other.

Referring to FIG. 2A, the channel portion 130n includes a first area Ar1, a second area Ar2 and a fourth area Ar4. In the thin film transistor 200 according to another embodiment of the present disclosure, the channel portion 130n includes a fourth area Ar4 spaced apart from the second area Ar2 with the first area Ar1 interposed therebetween. An effective gate voltage applied to the fourth area Ar4 is configured to be greater than that applied to the first area Ar1.

The first spacer 21 overlaps the second area Ar2 without overlapping the first area Ar1. The fourth area Ar4 of the channel portion 130n overlaps the second spacer 22. In this case, the first area Ar1 is disposed between the second area Ar2 and the fourth area Ar4.

According to another embodiment of the present disclosure, the first spacer 21 and the second spacer 22 are spaced apart from each other, and the first area Ar1 overlaps a gap space between the first spacer 21 and the second spacer 22.

Referring to FIG. 2B, a first capacitance Cap21 is formed between the first area Ar1 of the channel portion 130n and the first conductive material layer 71, a second capacitance Cap22 is formed between the second area Ar2 of the channel portion 130n and the first conductive material layer 71, and a fourth capacitance Cap24 is formed between the fourth area Ar4 of the channel portion 130n and the first conductive material layer 71.

According to another embodiment of the present disclosure, since a distance between the fourth area Ar4 of the channel portion 130n and the first conductive material layer 71 is greater than a distance between the first area Ar1 of the channel portion 130n and the first conductive material layer 71, the fourth capacitance Cap24 is smaller than the first capacitance Cap21. Thus, an effective gate voltage $V_{eff}$ in the fourth area Ar4 of the channel portion 130n is less reduced than that in the first area Ar1. As a result, the effective gate voltage $V_{eff}$ applied to the fourth area Ar4 is greater than that applied to the first area Ar1.

According to another embodiment of the present disclosure, when the gate voltage $V_{GS}$ is applied to the channel portion 130n, the increasing speed of the drain-source current $I_{DS}$ is reduced in the thin film transistor 200 by the first capacitance Cap21, the second capacitance Cap22 and the fourth capacitance Cap24, and the s-factor is increased. In particular, the s-factor of the thin film transistor 200 may be remarkably increased by the first capacitance Cap21.

In addition, according to another embodiment of the present disclosure, since the interval between the channel portion 130n and the gate electrode 150 does not need to be increased to increase the s-factor, the ON-current of the thin film transistor 200 may not be reduced in the state that the thin film transistor 200 is turned on. As a result, the thin film transistor 200 may have excellent ON-current characteristics. In the ON-state of the thin film transistor 200, in particular, the second area Ar2 and the fourth area Ar4 of the channel portion 130n become main current areas, so that the ON-current of the thin film transistor 200 may be improved.

Figure 3A:
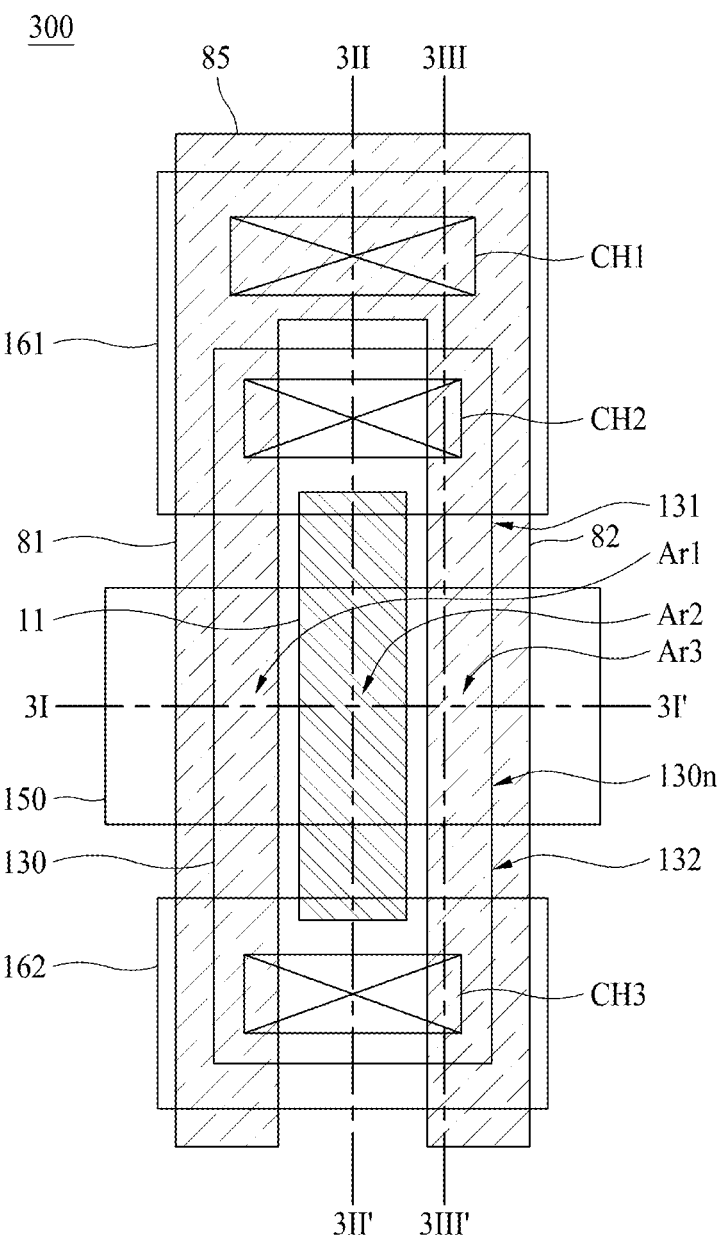
FIG. 3A is a plan view illustrating a thin film transistor according to still another embodiment of the present disclosure.
Figure 3B:
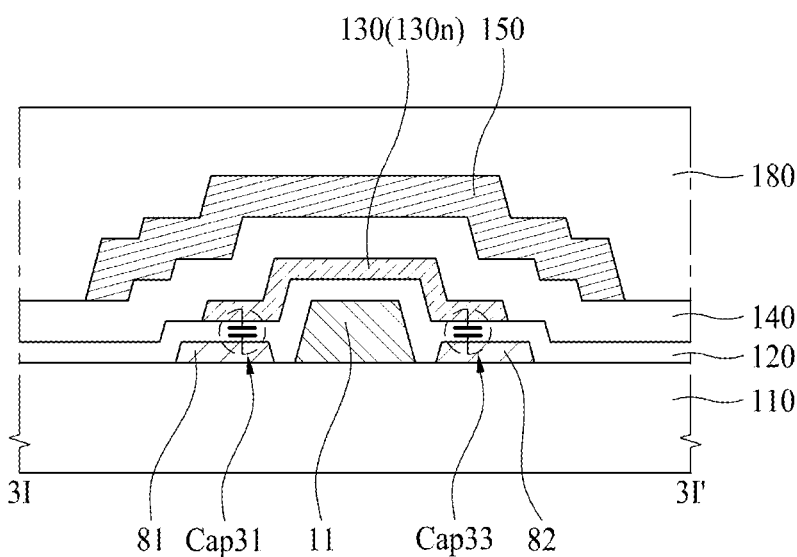
FIGS. 3B, 3C and 3D are cross-sectional views illustrating a thin film transistor according to still another embodiment of the present disclosure.
Figure 3C:
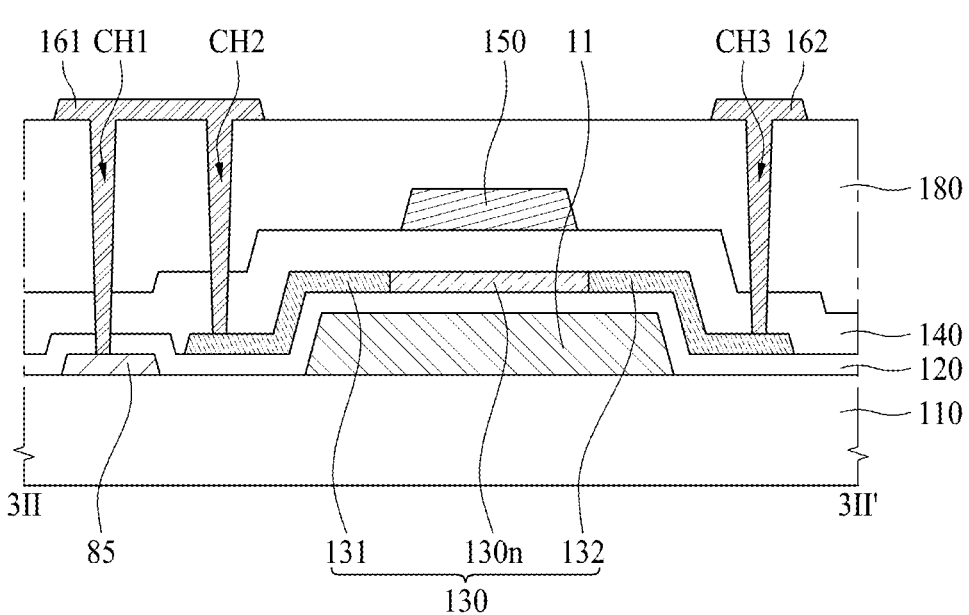
Figure 3D:
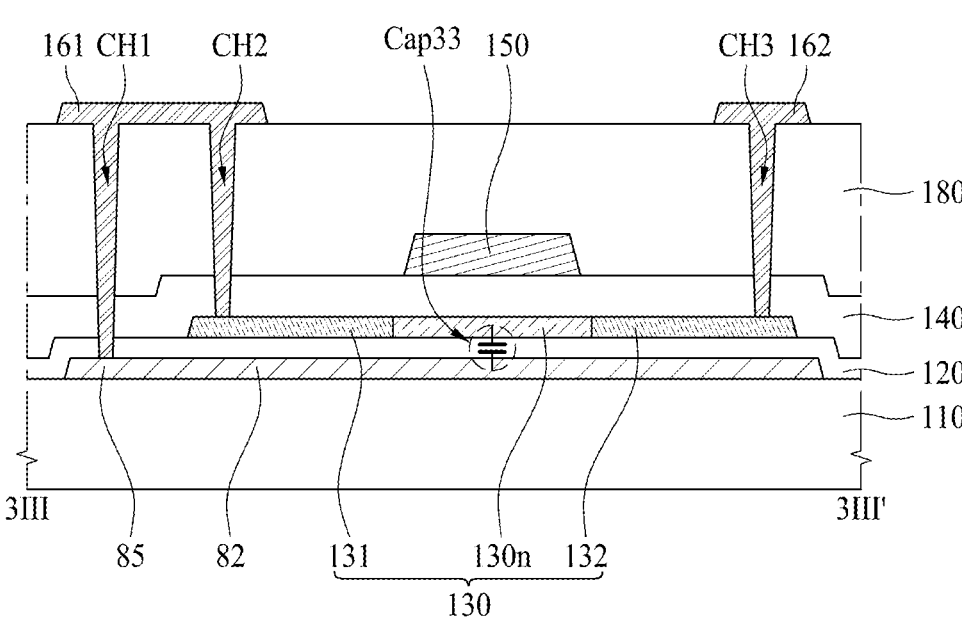

FIG. 3A is a plan view illustrating a thin film transistor 300 according to still another embodiment of the present disclosure, and FIGS. 3B, 3C and 3D are cross-sectional views illustrating a thin film transistor 300 according to still another embodiment of the present disclosure. In detail, FIG. 3B is a cross-sectional view taken along line 3I-3I' of FIG. 3A, FIG. 3C is a cross-sectional view taken along line 3II-3II' of FIG. 3A, and FIG. 3D is a cross-sectional view taken along line 3III-3III' of FIG. 3A.

The thin film transistor 300 of FIG. 3A includes a first conductive material layer 81 and a second conductive material layer 82 in comparison with the thin film transistor 100 of FIG. 1A.

Referring to FIGS. 3A and 3B, the first conductive material layer 81 and the second conductive material layer 82 are disposed on the substrate 110, and overlap the channel portion 130n. As shown in FIG. 3B, the channel portion 130n is disposed between the first conductive material layer 81 and the second conductive material layer 82 and the gate electrode 150.

Each of the first conductive material layer 81 and the second conductive material layer 82 is connected to the first connection portion 131.

Referring to FIGS. 3A and 3C, each of the first conductive material layer 81 and the second conductive material layer 82 is connected to a pad portion 85. The pad portion 85 may be integrally formed with the first conductive material layer 81 and the second conductive material layer 82. Referring to FIGS. 3C and 3D, the pad portion 85 is connected to the source electrode 161 through the contact hole CH1, and the source electrode 161 is connected to the first connection portion 131 through the contact hole CH2. As a result, each of the first conductive material layer 81 and the second conductive material layer 82 may be connected to the first connection portion 131 through the pad portion 85 and the source electrode 161.

Referring to FIGS. 3A and 3B, a first spacer 11 is disposed between the first conductive material layer 81 and the second conductive material layer 82. The first spacer 11 overlaps the channel portion 130n, and the channel portion 130n is disposed between the first spacer 11 and the gate electrode 150.

According to still another embodiment of the present disclosure, the first conductive material layer 81, the second conductive material layer 82 and the first spacer 11 may be disposed on the same layer (see FIG. 3B).

Referring to FIG. 3A, the channel portion 130n includes a first area Ar1, a second area Ar2, and a third area Ar3. The first area Ar1 overlaps the first conductive material layer 81, the second area Ar2 overlaps the first spacer 11, and the third area Ar3 overlaps the second conductive material layer 82.

The first conductive material layer 81 overlaps the first area Ar1, and does not overlap the second area Ar2. The first spacer 11 does not overlap the first area Ar1, and overlaps the second area Ar2.

The second conductive material layer 82 overlaps the third area Ar3, and does not overlap the first spacer 11.

Referring to FIG. 3B, a first capacitance Cap 31 is formed between the first area Ar1 of the channel portion 130n and the first conductive material layer 81, and a third capacitance Cap33 is formed between the third area Ar3 of the channel portion 130n and the second conductive material layer 82.

According to still another embodiment of the present disclosure, a capacitance Cap is not substantially formed between the second area Ar2 of the channel portion 130n and the substrate 110 below the second area Ar2. Therefore, the effective gate voltage $V_{eff}$ in the second area Ar2 of the channel portion 130n is less reduced than the effective gate voltage $V_{eff}$ in the first area Ar1 and the third area Ar3. As a result, the effective gate voltage $V_{eff}$ applied to the third area Ar3 is smaller than the effective gate voltage $V_{eff}$ applied to the second area Ar2.

According to still another embodiment of the present disclosure, when the gate voltage $V_{GS}$ is applied to the channel portion 130n, the increasing speed of the drain-source current $I_{DS}$ is reduced in the thin film transistor 300 by the first capacitance Cap31 and the third capacitance Cap33, and the s-factor is increased.

In addition, according to still another embodiment of the present disclosure, since the interval between the channel portion 130n and the gate electrode 150 does not need to be increased to increase the s-factor, the ON-current of the thin film transistor 300 does not need to be reduced in the state that the thin film transistor 300 is turned on. As a result, the thin film transistor 300 may have excellent ON-current characteristics. In the ON-state of the thin film transistor 300, in particular, the second area Ar2 of the channel portion 130n becomes a main current area, so that the ON-current of the thin film transistor 300 may be improved.

Figure 4A:
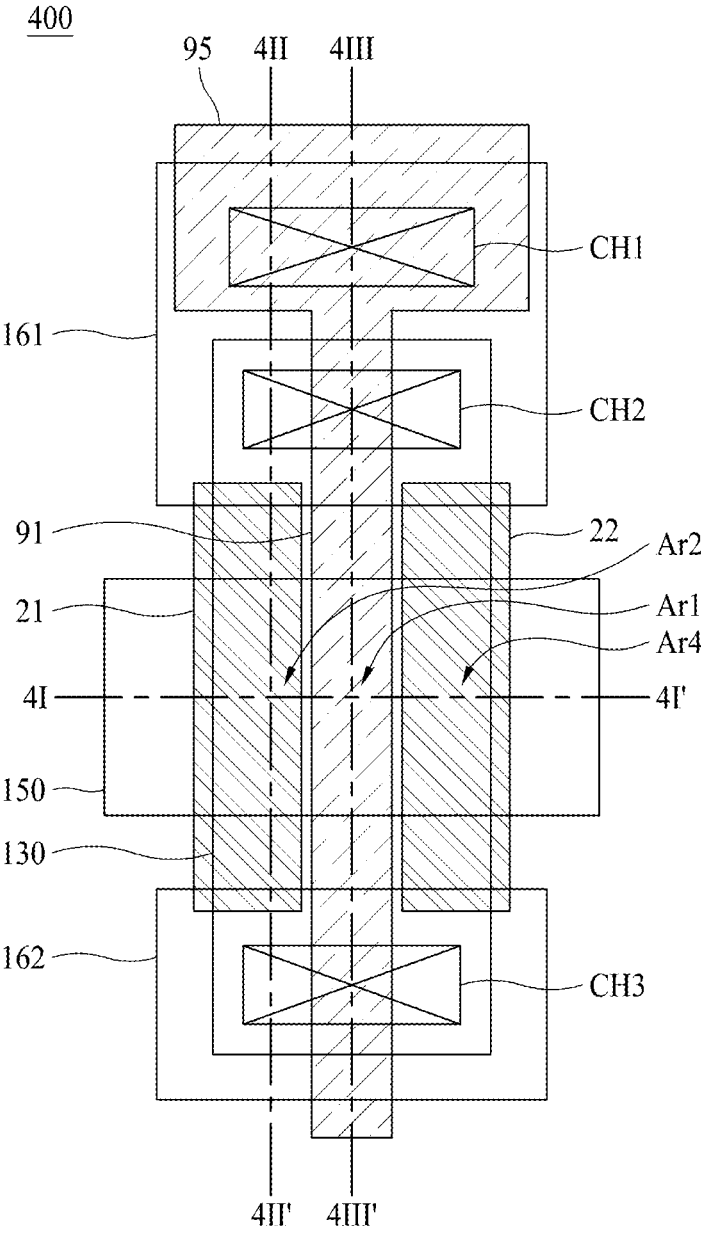
FIG. 4A is a plan view illustrating a thin film transistor according to further still another embodiment of the present disclosure.
Figure 4B:
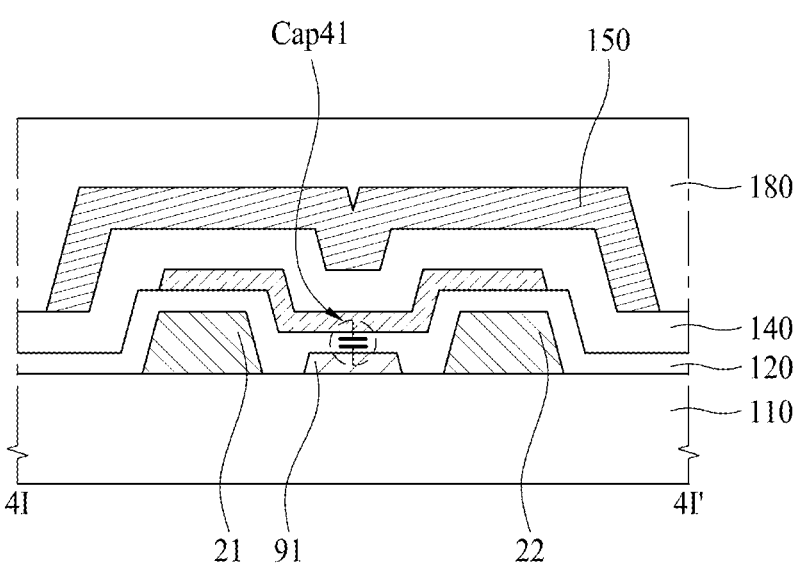
FIGS. 4B, 4C and 4D are cross-sectional views illustrating a thin film transistor according to further still another embodiment of the present disclosure.
Figure 4C:
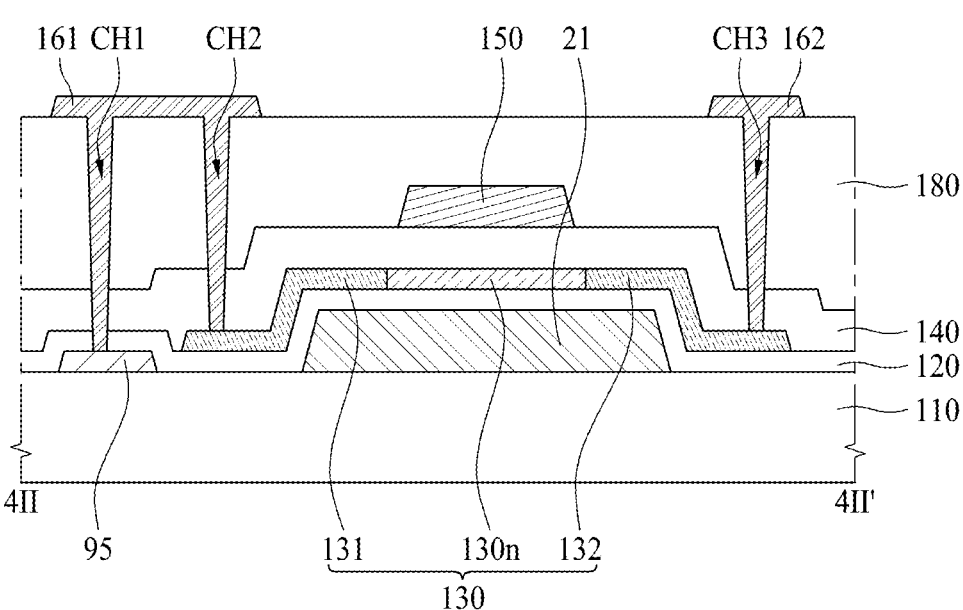
Figure 4D:
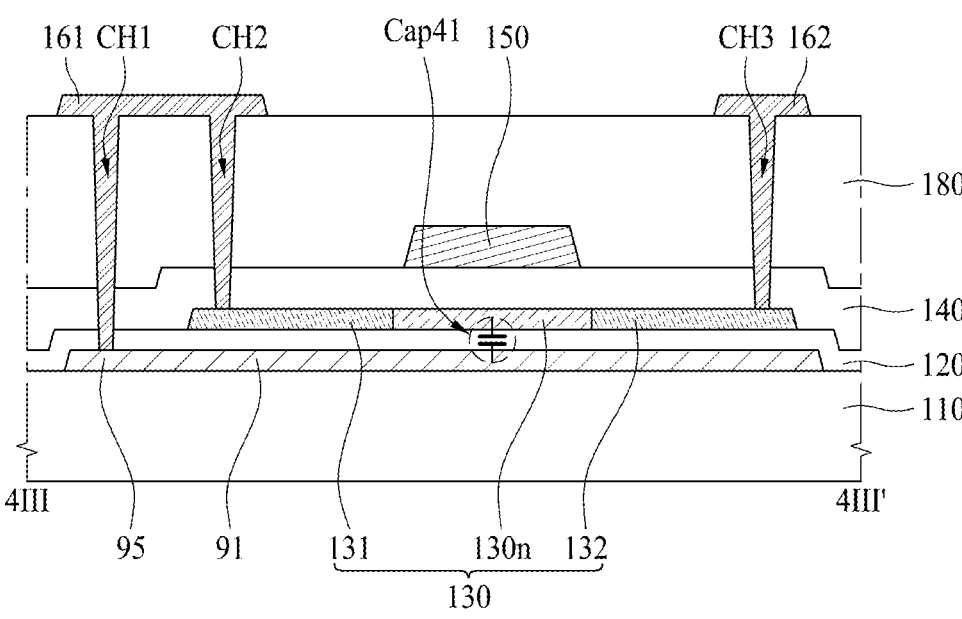

FIG. 4A is a plan view illustrating a thin film transistor 400 according to further still another embodiment of the present disclosure, and FIGS. 4B, 4C and 4D are cross-sectional views illustrating a thin film transistor 400 according to further still another embodiment of the present disclosure. In detail, FIG. 4B is a cross-sectional view taken along line 4I-4I' of FIG. 4A, FIG. 4C is a cross-sectional view taken along line 4II-4II' of FIG. 4A, and FIG. 4D is a cross-sectional view taken along line 4III-4III' of FIG. 4A.

The thin film transistor 400 of FIG. 4A includes a first conductive material layer 91 between the first spacer 21 and the second spacer 22 in comparison with the thin film transistor 200 of FIG. 2A.

In detail, the thin film transistor 400 of FIG. 4A includes a first conductive material layer 91 that overlaps the channel portion 130n, a first spacer 21 and a second spacer 22. The channel portion 130$n$ is disposed among the first conductive material layer 91, the first spacer 21, the second spacer 22 and the gate electrode 150.

The first conductive material layer 91 is connected to the first connection portion 131.

Referring to FIGS. 4A and 4C, the first conductive material layer 91 is connected to a pad portion 95. The pad portion 95 may be integrally formed with the first conductive material layer 91. Referring to FIGS. 4C and 4D, the pad portion 95 is connected to the source electrode 161 through the contact hole CH1, and the source electrode 161 is connected to the first connection portion 131 through the contact hole CH2. As a result, the first conductive material layer 91 may be connected to the first connection portion 131 through the pad portion 95 and the source electrode 161.

Referring to FIG. 4B, the first conductive material layer 91 is disposed between the first spacer 21 and the second spacer 22. According to further still another embodiment of the present disclosure, the first conductive material layer 91, the first spacer 21 and the second spacer 22 may be disposed on the same layer (see FIG. 4B).

Referring to FIG. 4A, the channel portion 130$n$ includes a first area Ar1, a second area Ar2, and a fourth area Ar4. The first area Ar1 overlaps the first conductive material layer 91, the second area Ar2 overlaps the first spacer 21, and the fourth area Ar4 overlaps the second spacer 22.

The first conductive material layer 91 overlaps the first area Ar1. The first area Ar1 is disposed between the second area Ar2 and the fourth area Ar4. The fourth area Ar4 may be extended from at least the first connection portion 131 to the second connection portion 132.

The first spacer 21 overlaps the second area Ar2 without overlapping the first area Ar1. The second spacer 22 overlaps the fourth area Ar4 without overlapping the first area Ar1.

Referring to FIGS. 4A and 4B, a first capacitance Cap41 is formed between the first area Ar1 of the channel portion 130$n$ and the first conductive material layer 91. However, a capacitance Cap is not substantially formed between the second area Ar2 of the channel portion 130$n$ and the substrate 110 below the second area Ar2. Also, the capacitance Cap is not formed between the fourth area Ar4 of the channel portion 130$n$ and the substrate 110 below the fourth area Ar4. Therefore, the effective gate voltage $V_{eff}$ in the second area Ar2 and the fourth area Ar4 of the channel portion 130$n$ is less reduced than the effective gate voltage $V_{eff}$ in the first area Ar1. As a result, the effective gate voltage $V_{eff}$ applied to each of the second area Ar2 and the fourth area Ar4 of the channel portion 130$n$ is greater than the effective gate voltage $V_{eff}$ applied to the first area Ar1.

According to further still another embodiment of the present disclosure, when the gate voltage $V_{GS}$ is applied to the channel portion 130$n$, the increasing speed of the drain-source current $I_{DS}$ is reduced in the thin film transistor 400 by the first capacitance Cap41, and the s-factor is increased.

In addition, according to further still another embodiment of the present disclosure, since the interval between the channel portion 130$n$ and the gate electrode 150 does not need to be increased to increase the s-factor, the ON-current of the thin film transistor 400 may not be reduced in the state that the thin film transistor 400 is turned on. As a result, the thin film transistor 400 may have improved/excellent ON-current characteristics. In the ON-state of the thin film transistor 400, in particular, the second area Ar2 and the fourth area Ar4 of the channel portion 130$n$ become main current areas, so that the ON-current of the thin film transistor 400 may be improved.

Figure 5A:
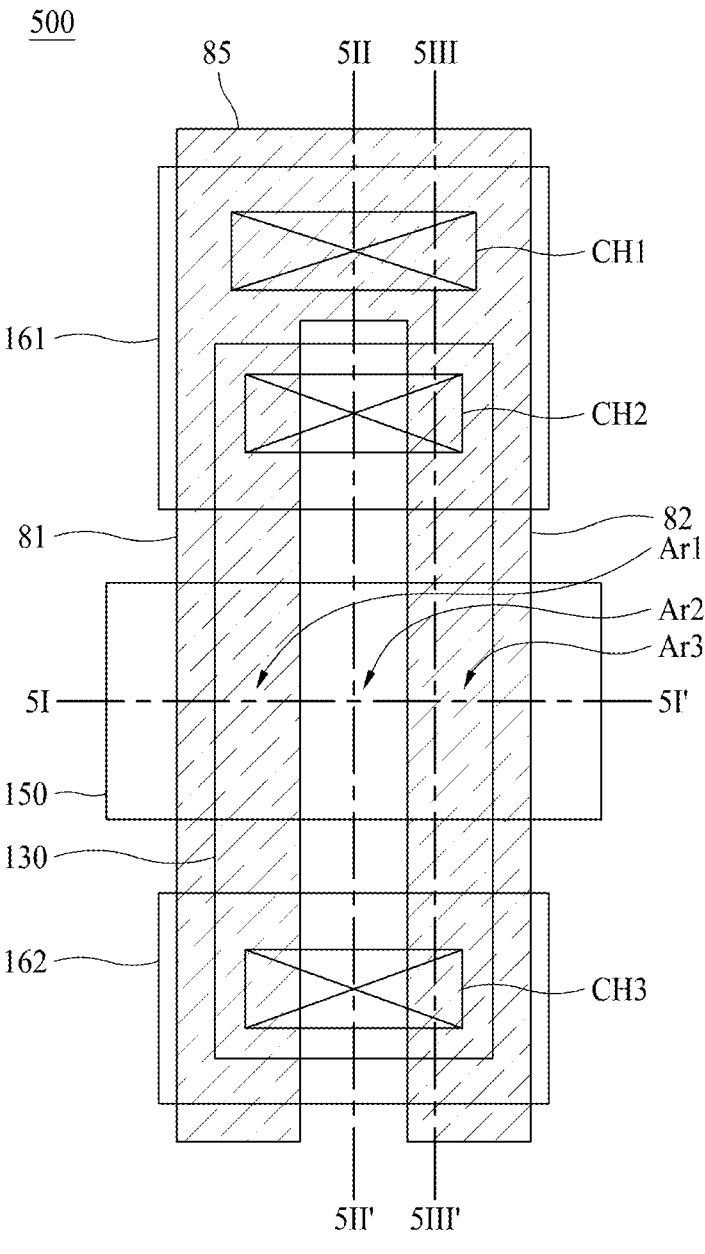
FIG. 5A is a plan view illustrating a thin film transistor according to further still another embodiment of the present disclosure.
Figure 5B:
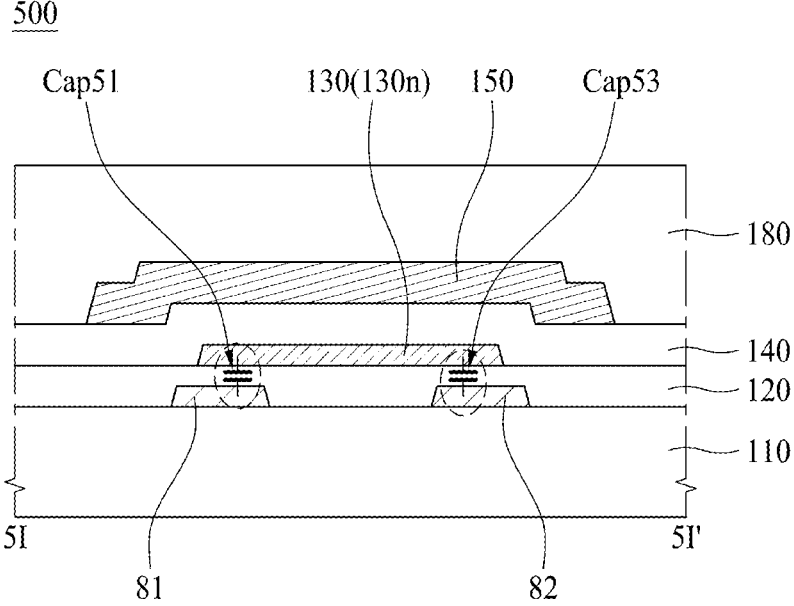
FIGS. 5B, 5C and 5D are cross-sectional views illustrating a thin film transistor according to further still another embodiment of the present disclosure.
Figure 5C:
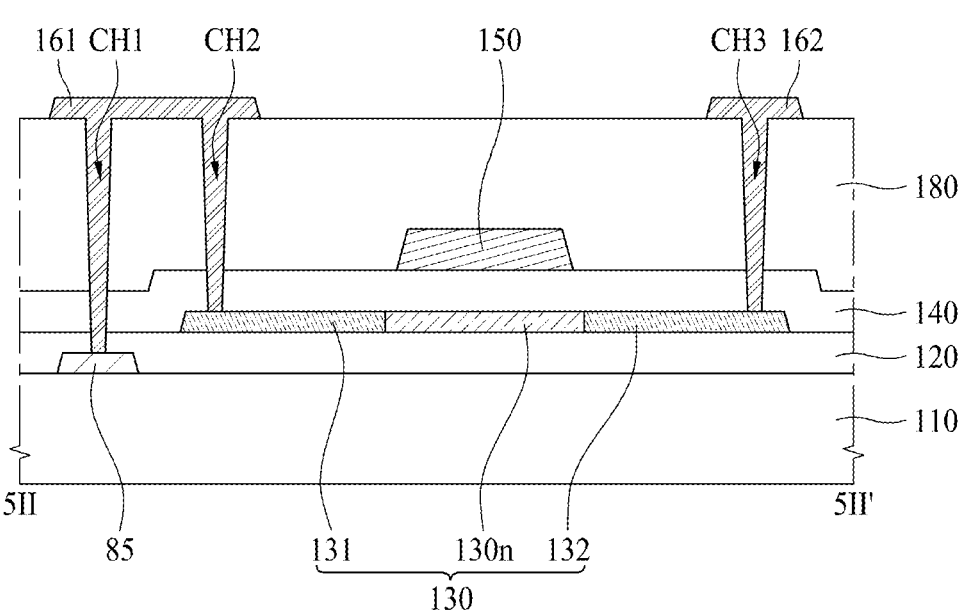
Figure 5D:
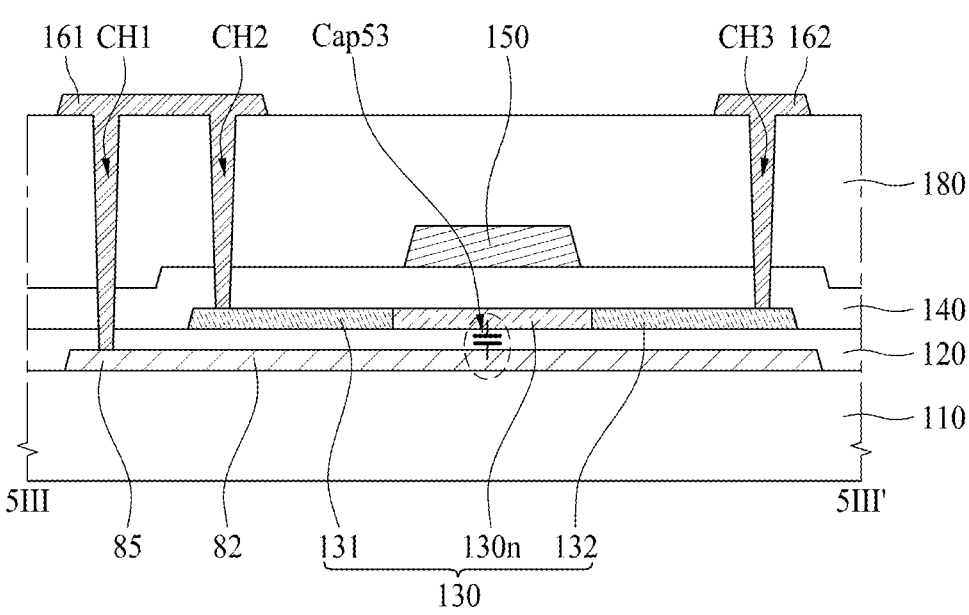

FIG. 5A is a plan view illustrating a thin film transistor according to further still another embodiment of the present disclosure, and FIGS. 5B, 5C and 5D are cross-sectional views illustrating a thin film transistor according to further still another embodiment of the present disclosure. In detail, FIG. 5B is a cross-sectional view taken along line 5I-5I' of FIG. 5A, FIG. 5C is a cross-sectional view taken along line 5II-5II' of FIG. 5A, and FIG. 5D is a cross-sectional view taken along line 5III-5III' of FIG. 5A.

The thin film transistor 500 of FIG. 5A does not include the first spacer 11 in comparison with the thin film transistor 300 of FIG. 3A.

Referring to FIGS. 5A and 5B, the first conductive material layer 81 and the second conductive material layer 82 are disposed on the substrate 110, and overlap the channel portion 130$n$. As shown in FIG. 5B, the channel portion 130$n$ is disposed between the first conductive material layer 81 and the second conductive material layer 82 and the gate electrode 150.

Each of the first conductive material layer 81 and the second conductive material layer 82 is connected to the first connection portion 131.

Referring to FIGS. 5A and 5C, each of the first conductive material layer 81 and the second conductive material layer 82 may be connected to the pad portion 85, and may be connected to the first connection portion 131 through the pad portion 85 and the source electrode 161.

According to further still another embodiment of the present disclosure, the first conductive material layer 81 and the second conductive material layer 82 may be disposed on the same layer (see FIG. 5B), but further still another embodiment of the present disclosure is not limited thereto. The first conductive material layer 81 and the second conductive material layer 82 may be disposed in their respective layers different from each other.

Referring to FIG. 5A, the channel portion 130$n$ includes a first area Ar1, a second area Ar2, and a third area Ar3. The first area Ar1 overlaps the first conductive material layer 81, and the third area Ar3 overlaps the second conductive material layer 82. According to further still another embodiment of the present disclosure, the first conductive material layer 81 and the second conductive material layer 82 are spaced apart from each other on a plane, and the second area Ar2 of the channel portion 130$n$ overlaps the gap space between the first conductive material layer 81 and the second conductive material layer 82.

The first conductive material layer 81 overlaps the first area Ar1, and does not overlap the second area Ar2. The second conductive material layer 82 overlaps the third area Ar3, and does not overlap the second area Ar2.

Referring to FIG. 5B, a first capacitance Cap51 is formed between the first area Ar1 of the channel portion 130$n$ and the first conductive material layer 81, and a third capacitance Cap53 is formed between the third area Ar3 of the channel portion 130$n$ and the second conductive material layer 82.

According to further still another embodiment of the present disclosure, a capacitance Cap is not substantially formed between the second area Ar2 of the channel portion 130$n$ and the substrate 110 below the second area Ar2. Therefore, the effective gate voltage $V_{eff}$ in the second area Ar2 of the channel portion 130$n$ is less reduced than the effective gate voltage $V_{eff}$ in the first area Ar1 and the third area Ar3. As a result, the effective gate voltage $V_{eff}$ applied to the third area Ar3 is smaller than that applied to the second area Ar2.

According to further still another embodiment of the present disclosure, when the gate voltage $V_{GS}$ is applied to the channel portion 130n, the increasing speed of the drain-source current $I_{DS}$ is reduced in the thin film transistor 500 by the first capacitance Cap51 and the third capacitance Cap53, and the s-factor is increased.

In addition, according to further still another embodiment of the present disclosure, since the interval between the channel portion 130n and the gate electrode 150 does not need to be increased to increase the s-factor, the ON-current of the thin film transistor 500 may not be reduced in the state that the thin film transistor 500 is turned on. As a result, the thin film transistor 500 may have improved/excellent ON-current characteristics.

Figure 6A:
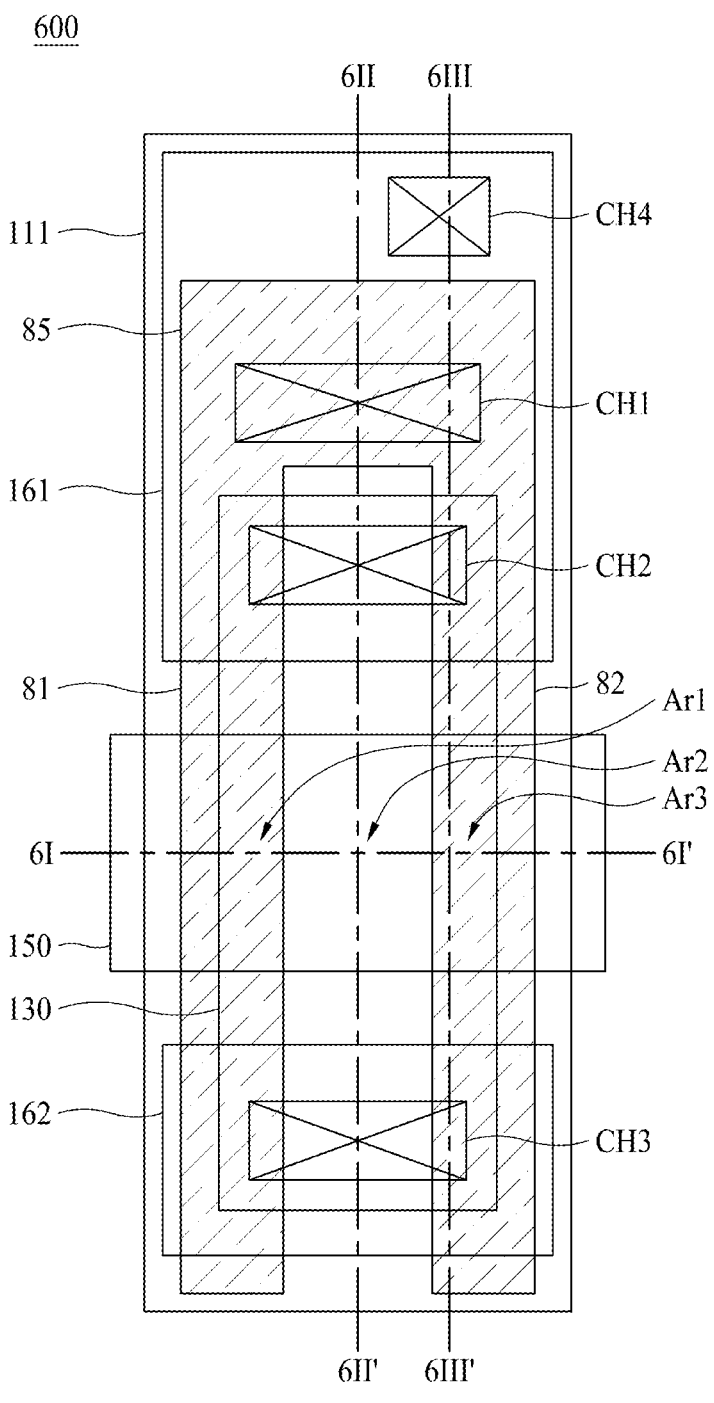
FIG. 6A is a plan view illustrating a thin film transistor according to further still another embodiment of the present disclosure.
Figure 6B:
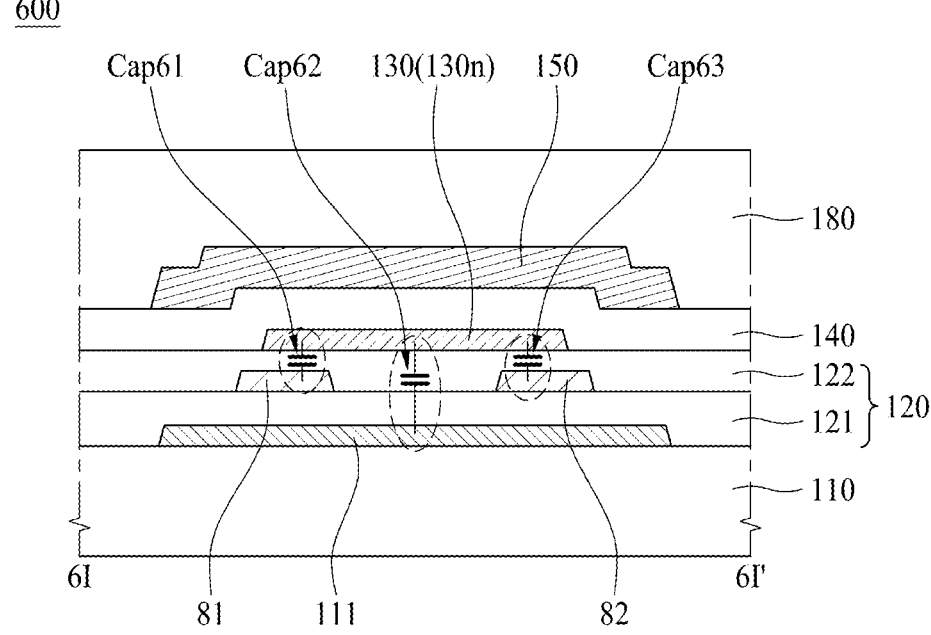
FIGS. 6B, 6C and 6D are cross-sectional views illustrating a thin film transistor according to further still another embodiment of the present disclosure.
Figure 6C:
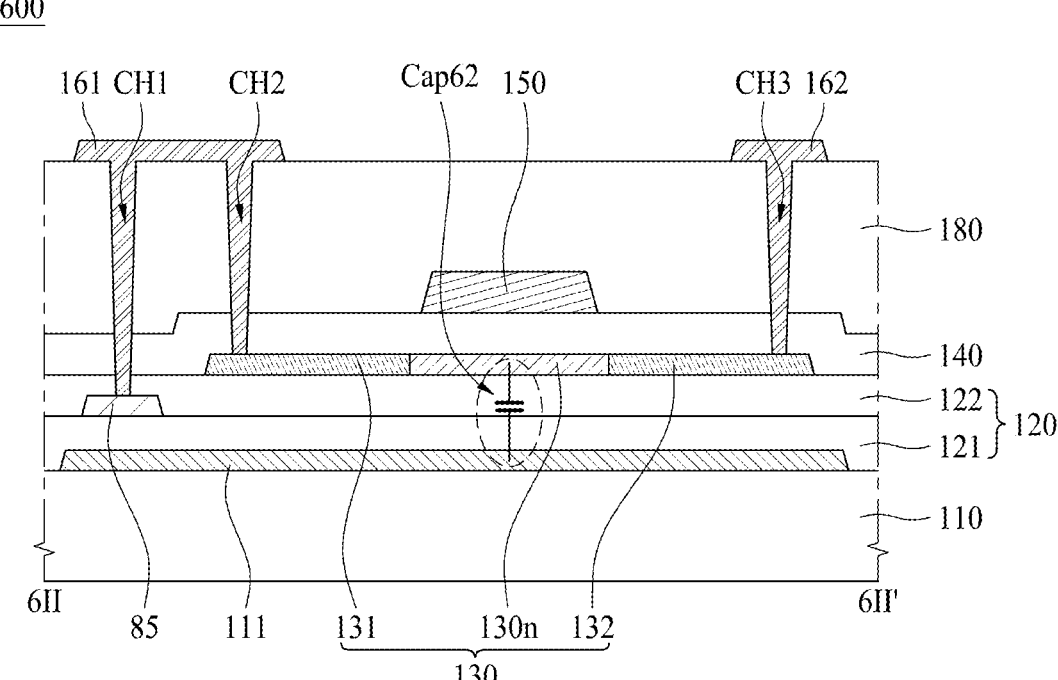
Figure 6D:
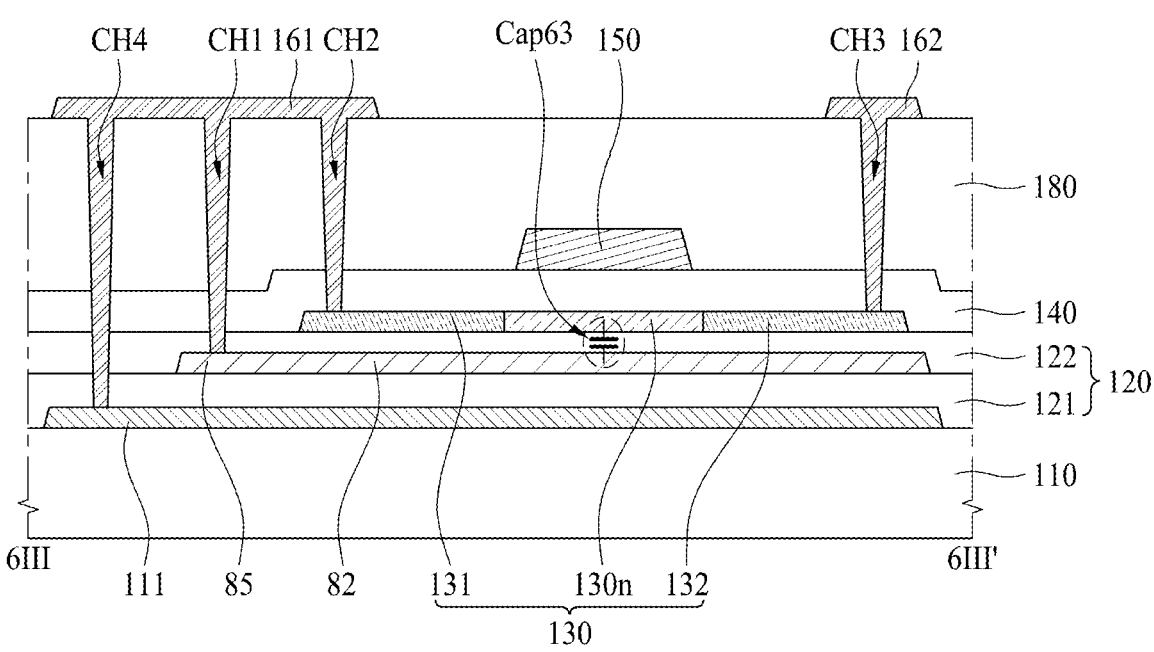

FIG. 6A is a plan view illustrating a thin film transistor 600 according to further still another embodiment of the present disclosure, and FIGS. 6B, 6C and 6D are cross-sectional views illustrating a thin film transistor 600 according to further still another embodiment of the present disclosure. In detail, FIG. 6B is a cross-sectional view taken along line 6I-6I' of FIG. 6A, FIG. 6C is a cross-sectional view taken along line 6II-6II' of FIG. 6A, and FIG. 6D is a cross-sectional view taken along line 6III-6III' of FIG. 6A.

The thin film transistor 600 of FIG. 6A further includes a conductive pattern 111 in comparison with the thin film transistor 500 of FIG. 5A.

Referring to FIGS. 6B to 6D, the conductive pattern 111 is disposed on the substrate 110.

The conductive pattern 111 has electrical conductivity. The conductive pattern 111 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), titanium (Ti), or iron (Fe). The conductive pattern 111 may have a multi-layered structure that includes at least two conductive layers having their respective physical properties different from each other.

The conductive pattern 111 may have light shielding characteristics. Therefore, the conductive pattern 111 may serve as a light shielding layer. The conductive pattern 111 may shield light incident from the outside to protect the channel portion 130n. The conductive pattern 111 may be referred to as the light shielding layer.

A first buffer layer 121 is disposed on the conductive pattern 111, the first conductive material layer 81 and the second conductive material layer 82 are disposed on the first buffer layer 121, and a second buffer layer 122 is disposed on the first conductive material layer 81 and the second conductive material layer 82. Both the first buffer layer 121 and the second buffer layer 122 may be referred to as a buffer layer 120. Both the first buffer layer 121 and the second buffer layer 122 are made of an insulating material. The first buffer layer 121 and the second buffer layer 122 may have the same composition, or may have their respective compositions different from each other.

An active layer 130 is disposed on the second buffer layer 122.

Referring to FIGS. 6A through 6D, the conductive pattern 111 is spaced apart from the active layer 130 with the first conductive material layer 81 and the second conductive material layer 82 interposed therebetween. The conductive pattern 111 overlaps the channel portion 130n.

According to further still another embodiment of the present disclosure, the conductive pattern 111 is connected to the first connection portion 131.

Referring to FIGS. 6A and 6D, the conductive pattern 111 is connected to the source electrode 161 through a contact hole CH4. Since the source electrode 161 is connected to the first connection portion 131 through the contact hole CH2, the conductive pattern 111 may be connected to the first connection portion 131 through the source electrode 161.

Each of the first conductive material layer 81 and the second conductive material layer 82 is connected to the first connection portion 131 through the pad portion 85 and the source electrode 161. Therefore, the same voltage may be applied to the conductive pattern 111, the first conductive material layer 81 and the second conductive material layer 82.

Referring to FIG. 6A, the channel portion 130n includes a first area Ar1, a second area Ar2, and a third area Ar3. The first area Ar1 overlaps the first conductive material layer 81, and the third area Ar3 overlaps the second conductive material layer 82. The second area Ar2 of the channel portion 130n overlaps the gap space between the first conductive material layer 81 and the second conductive material layer 82.

Referring to FIG. 6B, a first capacitance Cap61 is formed between the first area Ar1 of the channel portion 130n and the first conductive material layer 81, a second capacitance Cap62 is formed between the second area Ar2 of the channel portion 130n and the conductive pattern 111, and a third capacitance Cap63 is formed between the third area Ar3 of the channel portion 130n and the second conductive material layer 82.

A distance between the second area Ar2 of the channel portion 130n and the conductive pattern 111 is greater than a distance between the first area Ar1 of the channel portion 130n and the first conductive material layer 81 and a distance between the third area Ar3 of the channel portion 130n and the second conductive material layer 82. Therefore, the second capacitance Cap62 is smaller than the first capacitance Cap61 and the third capacitance Cap63. As a result, an effective gate voltage $V_{eff}$ in the second area Ar2 of the channel portion 130n is less reduced than that in the first area Ar1 and the third area Ar3, and the effective gate voltage $V_{eff}$ applied to the first area Ar1 and the third area Ar3 is smaller than that applied to the second area Ar2.

According to further still another embodiment of the present disclosure, when the gate voltage $V_{GS}$ is applied to the channel portion 130n, the increasing speed of the drain-source current $I_{DS}$ is reduced in the thin film transistor 600 by the first capacitance Cap61, the second capacitance Cap62 and the third capacitance Cap63, and the s-factor is increased.

In addition, according to further still another embodiment of the present disclosure, since the interval between the channel portion 130n and the gate electrode 150 does not need to be increased to increase the s-factor, the ON-current of the thin film transistor 600 may not be reduced in the state that the thin film transistor 600 is turned on. As a result, the thin film transistor 600 may have excellent ON-current characteristics.

Figure 7A:
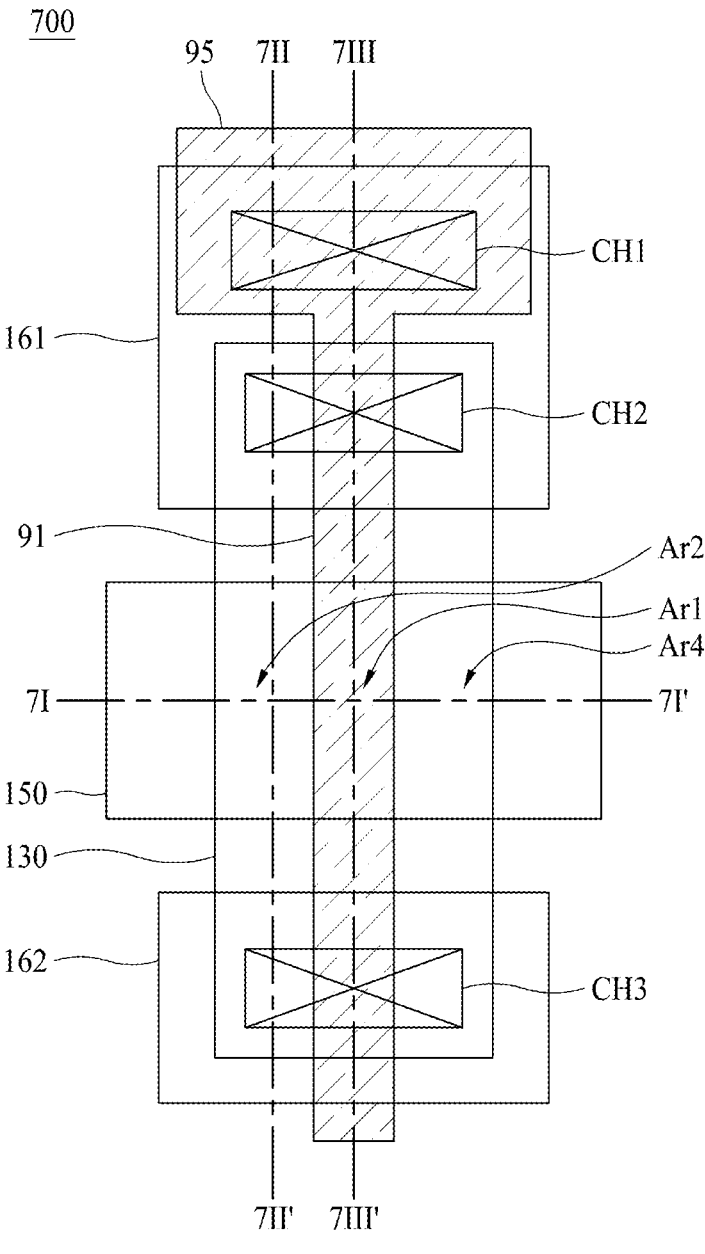
FIG. 7A is a plan view illustrating a thin film transistor according to further still another embodiment of the present disclosure.
Figure 7B:
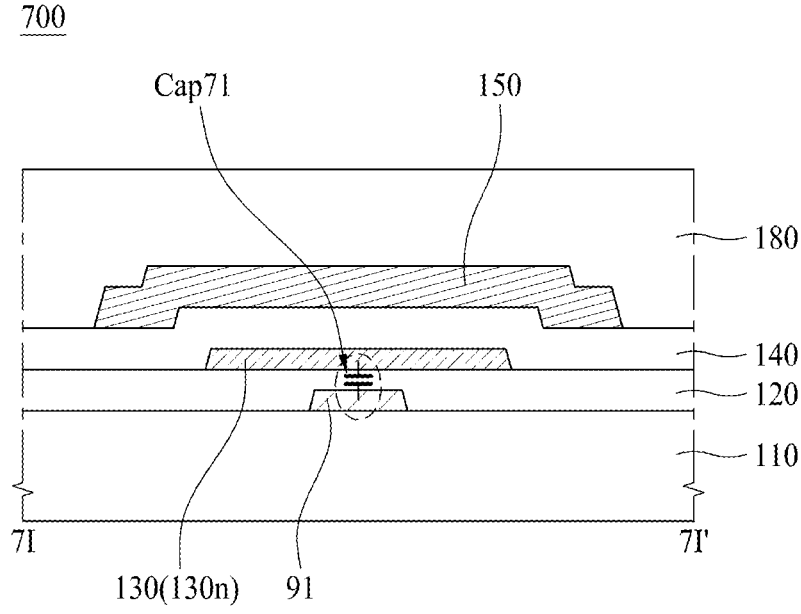
FIGS. 7B, 7C and 7D are cross-sectional views illustrating a thin film transistor according to further still another embodiment of the present disclosure.
Figure 7C:
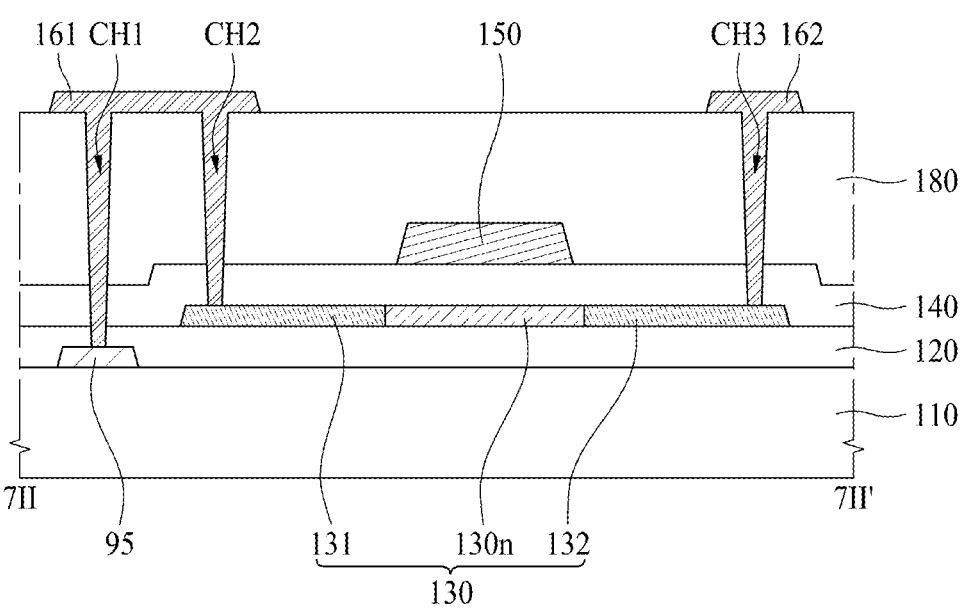
Figure 7D:
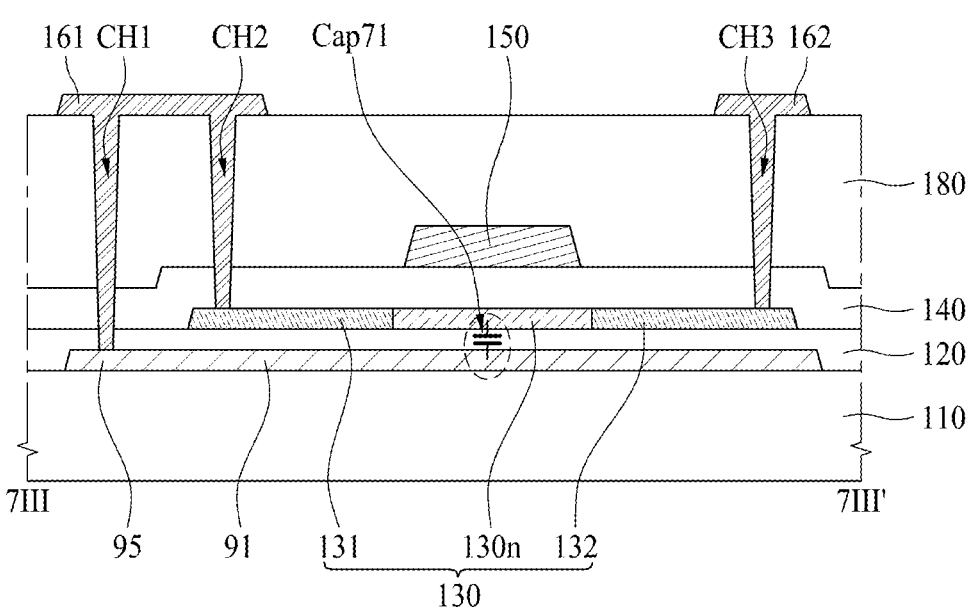

FIG. 7A is a plan view illustrating a thin film transistor 700 according to further still another embodiment of the present disclosure, and FIGS. 7B, 7C and 7D are cross-sectional views illustrating a thin film transistor 700 according to further still another embodiment of the present disclosure. In detail, FIG. 7B is a cross-sectional view taken along line 7I-7I' of FIG. 7A, FIG. 7C is a cross-sectional view taken along line 7II-7II' of FIG. 7A, and FIG. 7D is a cross-sectional view taken along line 7III-7III' of FIG. 7A.

The thin film transistor 700 of FIG. 7A does not include the first spacer 21 and the second spacer 22 in comparison with the thin film transistor 400 of FIG. 4A.

Referring to FIGS. 7A and 7B, the first conductive material layer 91 disposed on the substrate 110 overlaps the channel portion 130n. As shown in FIG. 7B, the channel portion 130n is disposed between the first conductive material layer 91 and the gate electrode 150.

The first conductive material layer 91 is connected to the first connection portion 131. Referring to FIGS. 7C and 7D, the first conductive material layer 91 may be connected to the first connection portion 131 through the pad portion 95 and the source electrode 161.

Referring to FIG. 7A, the channel portion 130n includes a first area Ar1, a second area Ar2, and a fourth area Ar4. The first area Ar1 overlaps the first conductive material layer 91. The second area Ar2 and the fourth area Ar4 do not overlap the first conductive material layer 91. According to further still another embodiment of the present disclosure, the first area Ar1 may be positioned between the second area Ar2 and the fourth area Ar4.

Referring to FIG. 7B, a first capacitance Cap71 is formed between the first area Ar1 of the channel portion 130n and the first conductive material layer 91. However, a capacitance Cap is not substantially formed between the second area Ar2 of the channel portion 130n and the substrate 110 below the second area Ar2. Also, the capacitance Cap is not formed between the fourth area Ar4 of the channel portion 130n and the substrate 110 below the fourth area Ar4. Therefore, the effective gate voltage $V_{eff}$ in the second area Ar2 and the fourth area Ar4 of the channel portion 130n is less reduced than the effective gate voltage $V_{eff}$ in the first area Ar1. As a result, the effective gate voltage $V_{eff}$ applied to each of the second area Ar2 and the fourth area Ar4 of the channel portion 130n is greater than the effective gate voltage $V_{eff}$ applied to the first area Ar1.

According to further still another embodiment of the present disclosure, when the gate voltage $V_{GS}$ is applied to the channel portion 130n, the increasing speed of the drain-source current $I_{DS}$ is reduced in the thin film transistor 700 by the first capacitance Cap71, and the s-factor is increased.

In addition, according to further still another embodiment of the present disclosure, since the interval between the channel portion 130n and the gate electrode 150 does not need to be increased to increase the s-factor, the ON-current of the thin film transistor 700 may not be reduced in the state that the thin film transistor 700 is turned on. As a result, the thin film transistor 700 may have excellent ON-current characteristics. In the ON-state of the thin film transistor 700, in particular, the second area Ar2 and the fourth area Ar4 of the channel portion 130n become main current areas, so that the ON-current of the thin film transistor 700 may be improved.

Figure 8A:
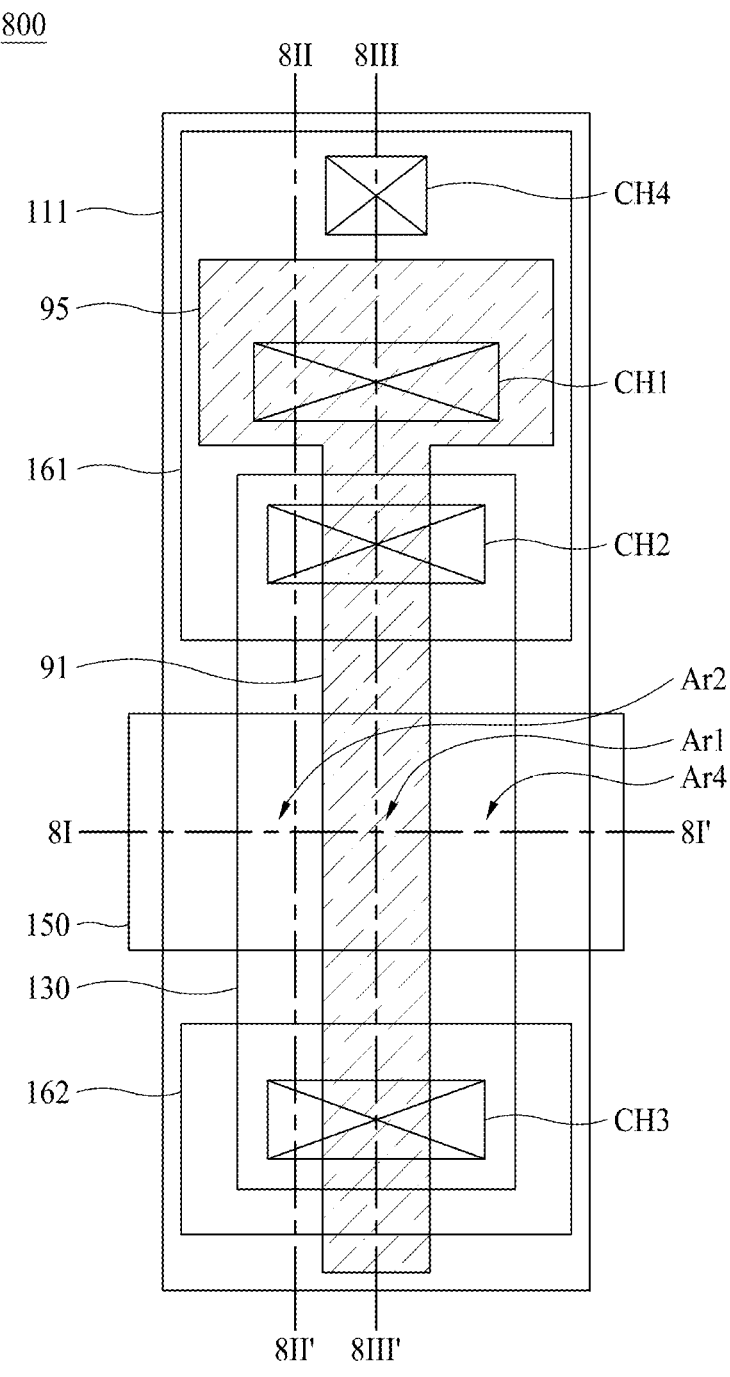
FIG. 8A is a plan view illustrating a thin film transistor according to further still another embodiment of the present disclosure.
Figure 8B:
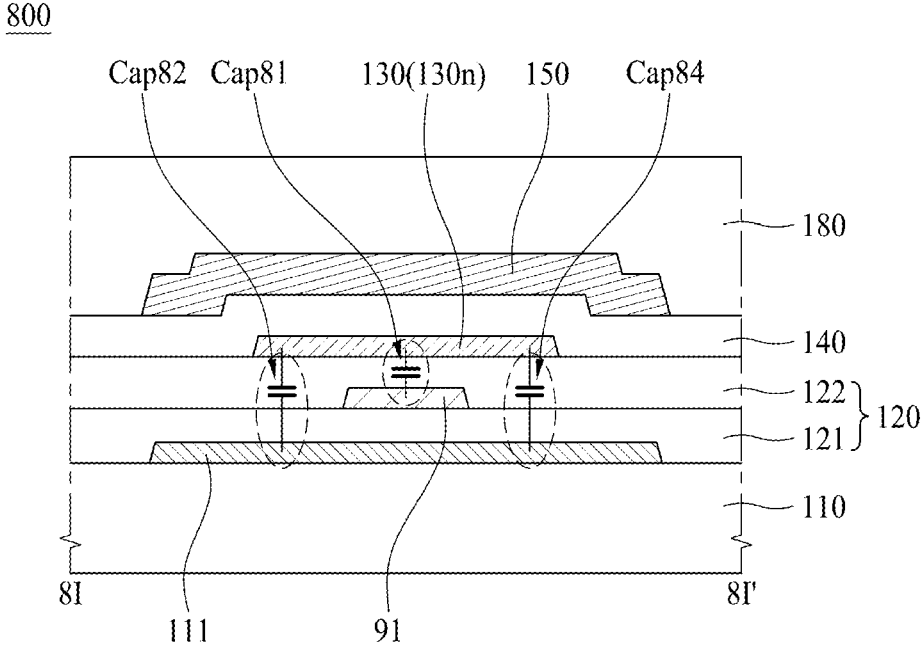
FIGS. 8B, 8C and 8D are cross-sectional views illustrating a thin film transistor according to further still another embodiment of the present disclosure.
Figure 8C:
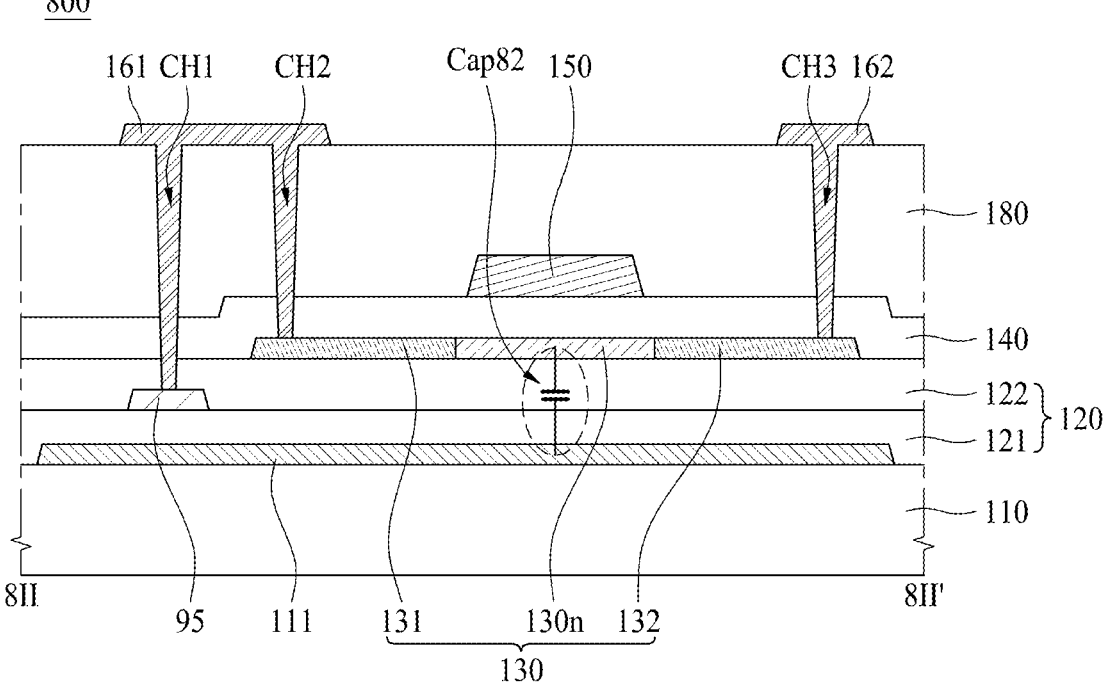
Figure 8D:
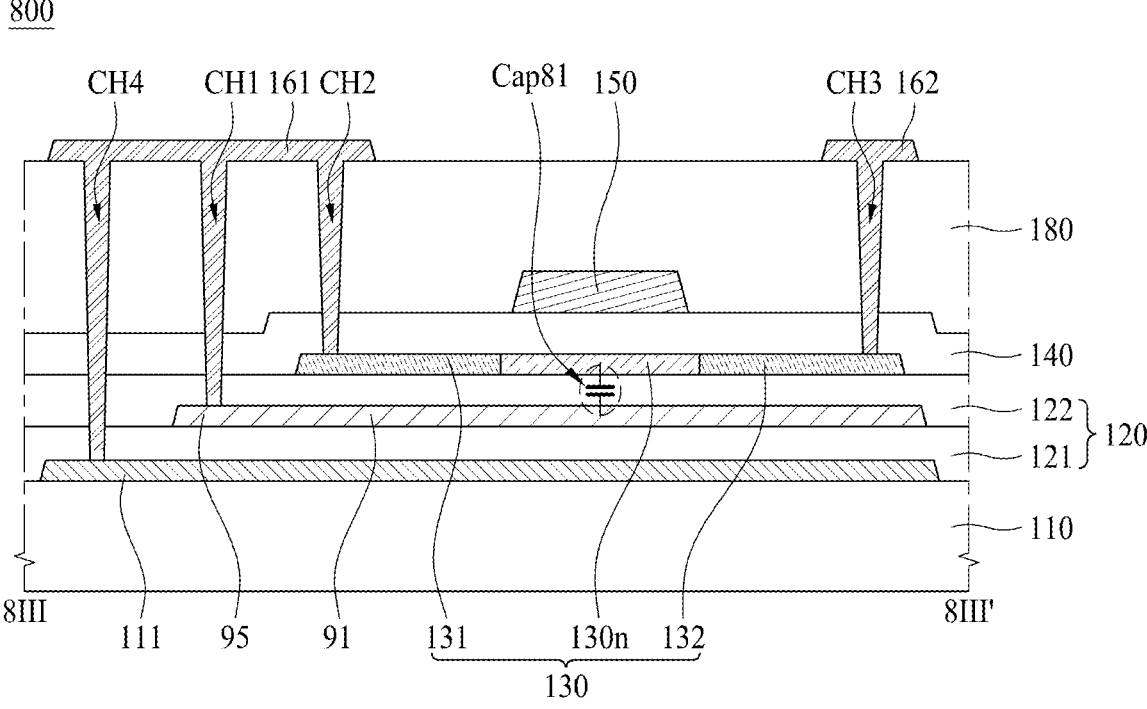

FIG. 8A is a plan view illustrating a thin film transistor according to further still another embodiment of the present disclosure, and FIGS. 8B, 8C and 8D are cross-sectional views illustrating a thin film transistor according to further still another embodiment of the present disclosure. In detail, FIG. 8B is a cross-sectional view taken along line 8I-8I' of FIG. 8A and FIG. 8C is a cross-sectional view taken along line 8II-8II' of FIGS. 8A and 8D is a cross-sectional view taken along line 8III-8III' of FIG. 8A.

The thin film transistor 800 of FIG. 8A further includes a conductive pattern 111 in comparison with the thin film transistor 700 of FIG. 7A.

Referring to FIGS. 8B to 8D, the conductive pattern 111 is disposed on the substrate 110.

The conductive pattern 111 has electrical conductivity. In addition, the conductive pattern 111 may have light shielding characteristics. Therefore, the conductive pattern 111 may be referred to as a light shielding layer.

A first buffer layer 121 is disposed on the conductive pattern 111, a first conductive material layer 91 is disposed on the first buffer layer 121, a second buffer layer 122 is disposed on the first conductive material layer 91, and an active layer 130 is disposed on the second buffer layer 122.

Referring to FIGS. 8A to 8D, the conductive pattern 111 is spaced apart from the active layer 130 with the first conductive material layer 91 interposed therebetween.

The conductive pattern 111 overlaps the channel portion 130n, and is connected to the first connection portion 131.

Referring to FIGS. 8A and 8D, the conductive pattern 111 is connected to the source electrode 161 through the contact hole CH4. Since the source electrode 161 is connected to the first connection portion 131 through the contact hole CH2, the conductive pattern 111 may be connected to the first connection portion 131 through the source electrode 161.

The first conductive material layer 91 is connected to the first connection portion 131 through the pad portion 95 and the source electrode 161. Therefore, the same voltage may be applied to the conductive pattern 111 and the first conductive material layer 91.

Referring to FIG. 8A, the channel portion 130n includes a first area Ar1, a second area Ar2, and a fourth area Ar4. The first area Ar1 overlaps the first conductive material layer 91. The first area Ar1 may be positioned between the second area Ar2 and the fourth area Ar4.

Referring to FIG. 8B, a first capacitance Cap81 is formed between the first area Ar1 of the channel portion 130n and the first conductive material layer 91, a second capacitance Cap82 is formed between the second area Ar2 of the channel portion 130n and the conductive pattern 111, and a fourth capacitance Cap84 is formed between the fourth area Ar4 of the channel portion 130n and the conductive pattern 111.

A distance between the second area Ar2 of the channel portion 130n and the conductive pattern 111 and a distance between the fourth area Ar4 and the conductive pattern 111 are greater than a distance between the first area Ar1 of the channel portion 130n and the first conductive material layer 91. Therefore, the second capacitance Cap82 and the fourth capacitance Cap84 are smaller than the first capacitance Cap81. As a result, the effective gate voltage $V_{eff}$ in the second area Ar2 and the fourth area Ar4 of the channel portion 130n is reduced to be smaller than the effective gate voltage $V_{eff}$ in the first area Ar1, and the effective gate voltage $V_{eff}$ applied to the first area Ar1 is smaller than that applied to the second area Ar2 and the fourth area Ar4.

According to further still another embodiment of the present disclosure, when the gate voltage $V_{GS}$ is applied to the channel portion 130n, the increasing speed of the drain-source current $I_{DS}$ is reduced in the thin film transistor 800 by the first capacitance Cap81, the second capacitance Cap82 and the fourth capacitance Cap84, and the s-factor is increased.

In addition, according to further still another embodiment of the present disclosure, since the interval between the channel portion 130n and the gate electrode 150 does not need to be increased to increase the s-factor, the on-state current of the thin film transistor 800 does not need to be reduced in the state that the thin film transistor 800 is turned on. As a result, the thin film transistor 800 may have excellent ON-current characteristics.

FIG. 11 is a threshold voltage graph for thin film transistors. The threshold voltage graph for the thin film transistors is represented by a graph of the drain-source current $I_{DS}$ for the gate voltage $V_{GS}$.

In FIG. 11, "Embodiment 1" is a threshold voltage graph for the thin film transistor 100 of FIG. 1.

In FIG. 11, "Comparative Example 1" is a threshold voltage graph for a thin film transistor of the Comparative Example 1. In comparison with the thin film transistor 100 of FIG. 1B, the thin film transistor according to the Comparative Example 1 does not include a first conductive material layer 71 and a first spacer 11.

In FIG. 11, "Comparative Example 2" is a threshold voltage graph for a thin film transistor of the Comparative Example 2. In comparison with the thin film transistor 100 of FIG. 1B, the thin film transistor according to the Comparative Example 2 has a great thickness of the gate insulating layer 140 to increase the s-factor of the thin film transistor instead of having the first conductive material layer 71 and the first spacer 11, whereby the spaced distance between the channel portion 130$n$ and the gate electrode 150 is increased.

Referring to FIG. 11, it is noted that the thin film transistor of Embodiment 1 has an s-factor greater than that of the thin film transistor of Comparative Example 1 at the period of the threshold voltage Vth. It is also noted that the thin film transistor of the Embodiment 1 has an ON-current larger than that of the thin film transistor of the Comparative Example 2. As described above, according to one embodiment of the present disclosure, a thin film transistor having a large s-factor and having excellent ON-current characteristics may be manufactured.

Figure 12:
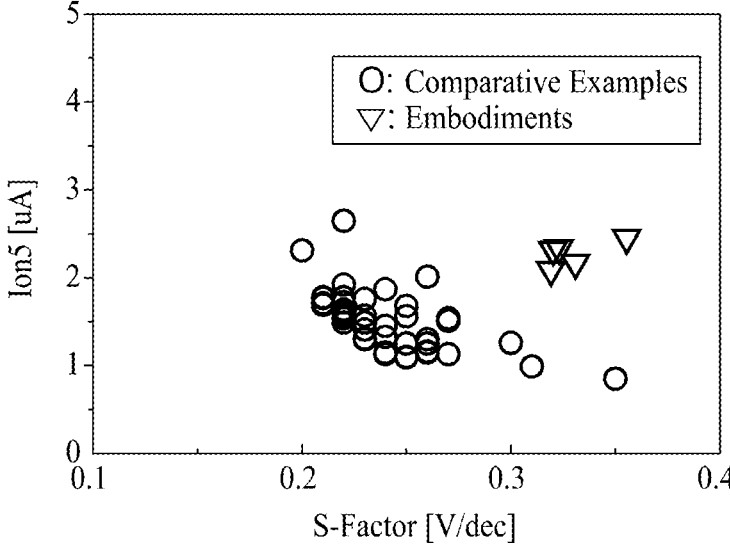
FIG. 12 is a distribution graph illustrating an s-factor and an ON-current of thin film transistors.

FIG. 12 is a distribution graph illustrating an s-factor and an ON-current of thin film transistors. In this case, the ON-current Ion5 represents a magnitude of a current when the gate voltage $V_{GS}$ is 5V. Referring to FIG. 12, it is noted that the thin film transistors according to the embodiments of the present disclosure have a large s-factor and a large ON-current as compared with the thin film transistors according to comparative examples.

Hereinafter, the display device comprising the above-described thin film transistors 100, 200, 300, 400, 500, 600, 700 and 800 will be described in detail.

Figure 13:
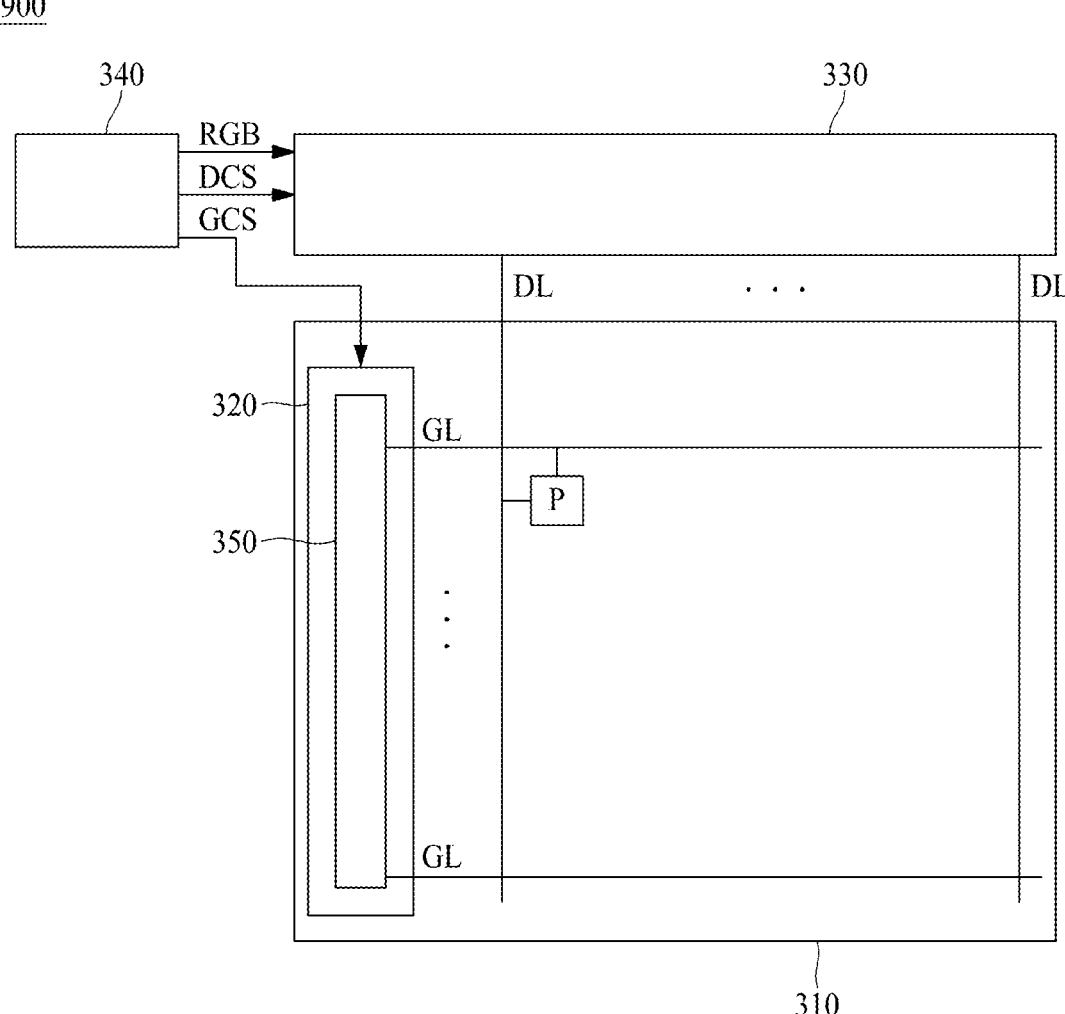
FIG. 13 is a schematic view illustrating a display device according to another embodiment of the present disclosure.

FIG. 13 is a schematic view illustrating a display device 900 according to another embodiment of the present disclosure.

As shown in FIG. 13, the display device 900 according to another embodiment of the present disclosure includes a display panel 310, a gate driver 320, a data driver 330 and a controller 340.

Gate lines GL and data lines DL are disposed in the display panel 310 and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off the switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure.

Figure 14:
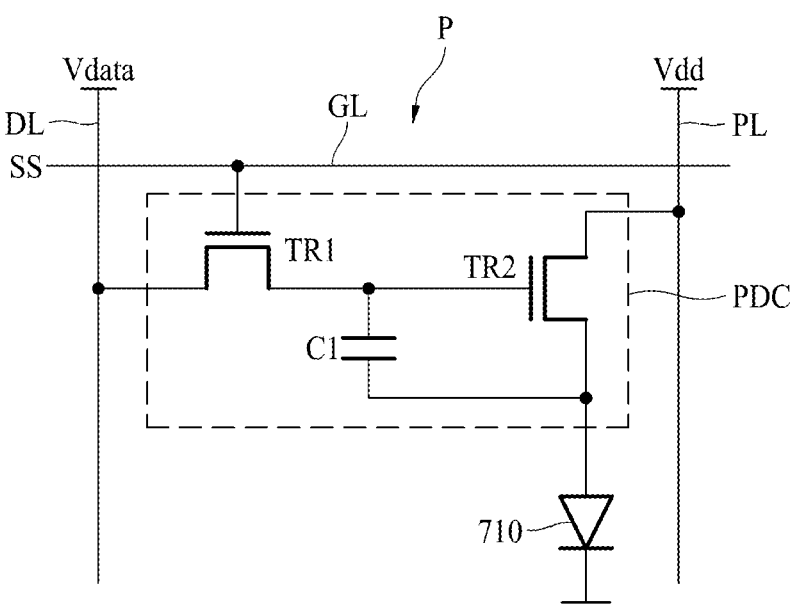
FIG. 14 is a circuit diagram illustrating any one pixel of FIG. 13.
Figure 15:
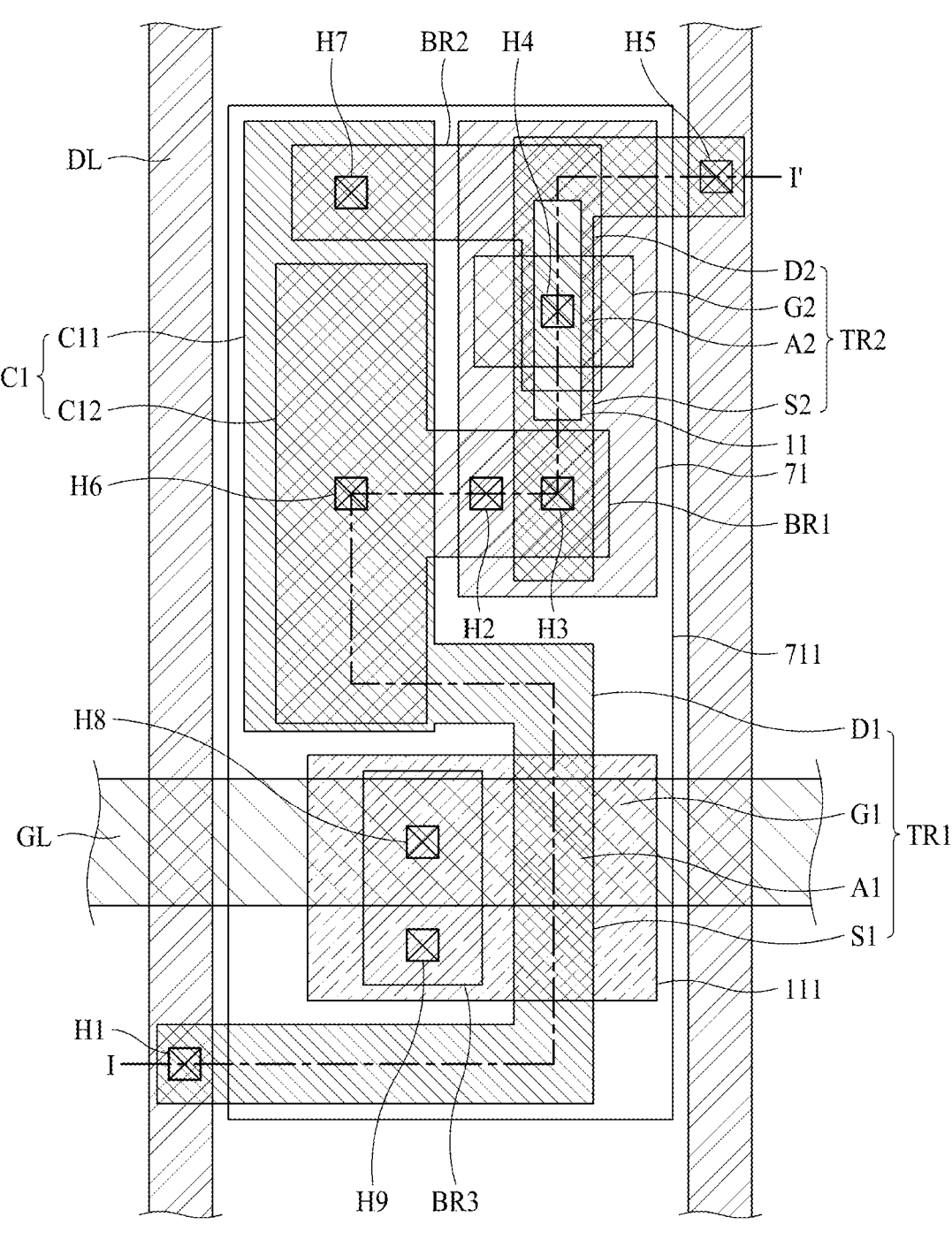
FIG. 15 is a plan view illustrating the pixel of FIG. 14.
Figure 16:
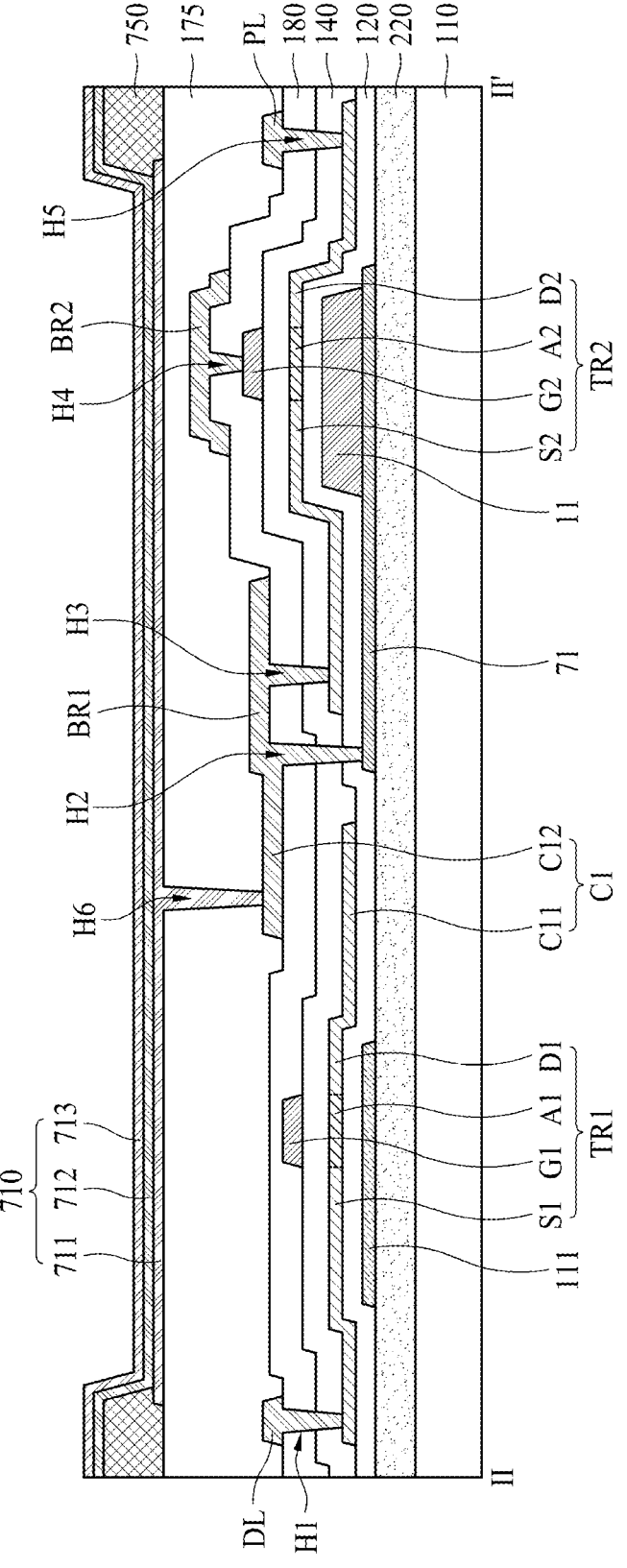
FIG. 16 is a cross-sectional view taken along line I-I' of FIG. 15.

FIG. 14 is a circuit diagram illustrating any one pixel P of FIG. 13, FIG. 15 is a plan view illustrating a pixel P of FIG. 14, and FIG. 16 is a cross-sectional view taken along line I-I' of FIG. 15.

The circuit diagram of FIG. 14 is an equivalent circuit diagram for the pixel P of the display device 900 that includes an organic light emitting diode (OLED) as a display element 710.

The pixel P includes a display element 710 and a pixel driving circuit PDC for driving the display element 710.

The pixel driving circuit PDC of FIG. 14 includes a first thin film transistor TR1 that is a switching transistor and a second thin film transistor TR2 that is a driving transistor. For example, the thin film transistors 100, 200, 300, 400, 500, 600, 700 and 800 described in the embodiments may be used as the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 15 and 16, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A lower buffer layer 220 is disposed on the substrate 110, and a first conductive material layer 71 is disposed on the lower buffer layer 220. Referring to FIGS. 15 and 16, the first conductive material layer 71 is disposed only in the second thin film transistor TR2 that is a driving transistor, but one embodiment of the present disclosure is not limited thereto, and the first conductive material layer 71 may be disposed in the first thin film transistor TR1.

Also, a light shielding layer 111 may be disposed on the substrate 110. The light shielding layer 111 may be disposed below the first conductive material layer 71. For example, the light shielding layer 111 may be disposed on the substrate 110, the lower buffer layer 220 may be disposed on the light shielding layer 111, and the first conductive material layer 71 may be disposed on the lower buffer layer 220.

The light shielding layer 111 is disposed below the first thin film transistor TR1 as exemplarily shown in FIGS. 15 and 16.

Referring to FIGS. 15 and 16, a first spacer 11 is disposed on the first conductive material layer 71.

A buffer layer 120 is disposed on the first conductive material layer 71, the first spacer 11 and the light shielding layer 111. The buffer layer 120 is made of an insulating material, and protects active layers A1 and A2 from external water or oxygen.

The first active layer A1 of the first thin film transistor TR1 and the second active layer A2 of the second thin film transistor TR2 are disposed on the buffer layer 120.

Each of the first and second active layers A1 and A2 may include at least one of, for example, an amorphous silicon semiconductor material, a polycrystalline silicon semiconductor material or an oxide semiconductor material. Each of the first and second active layers A1 and A2 may be made of an oxide semiconductor layer made of an oxide semiconductor material.

In the first thin film transistor TR1, the first active layer A1 may include a channel portion, a first connection portion and a second connection portion. The channel portion of the first active layer A1 overlaps a gate electrode G1. According to another embodiment of the present disclosure, the first connection portion may be referred to as a first source electrode S1, and the second connection portion may be referred to as a first drain electrode D1.

In the second thin film transistor TR2, the second active layer A2 may include a channel portion, a first connection portion and a second connection portion. The channel portion of the second active layer A2 overlaps the gate electrode G2. According to another embodiment of the present disclosure, the first connection portion may be referred to as a second drain electrode D2, and the second connection portion may be referred to as a second source electrode S2.

Referring to FIGS. 15 and 16, a portion of the first active layer A1 may be conductorized to become a first capacitor electrode C11 of the first capacitor C1.

A gate insulating layer 140 is disposed on the first and second active layers A1 and A2. The gate insulating layer 140 may cover entire upper surfaces of the first and second active layers A1 and A2, or may cover only a portion of the first active layer A1 and the second active layer A2.

The gate electrode G1 of the first thin film transistor TR1 and the gate electrode G2 of the second thin film transistor TR2 are disposed on the gate insulating layer 140.

An interlayer insulating layer 180 is disposed on the gate electrodes G1 and G2.

The data line DL and the driving power line PL are disposed on the interlayer insulating layer 180.

The data line DL is in contact with the first source electrode S1 formed in the first active layer A1 through a first contact hole H1. According to another embodiment of the present disclosure, a portion of the data line DL overlapped with the first active layer A1 may be referred to as the first source electrode S1.

The driving power line PL is in contact with the second drain electrode D2 formed in the second active layer A2 through a fifth contact hole H5. According to another embodiment of the present disclosure, a portion of the driving power line PL overlapped with the second active layer A2 may be referred to as the second drain electrode D2.

Referring to FIGS. 15 and 16, a second capacitor electrode C12 of the first capacitor C1, a first bridge BR1 and a second bridge BR2 are disposed on the interlayer insulating layer 180.

The second capacitor electrode C12 overlaps the first capacitor electrode C11 to form the first capacitor C1.

The first bridge BR1 may be integrally formed with the second capacitor electrode C12. The first bridge BR1 is connected to the first conductive material layer 71 through a second contact hole H2, and is connected to the second source electrode S2 through a third contact hole H3. As a result, the first conductive material 71 may be connected to the second source electrode S2 of the second thin film transistor TR2.

The second bridge BR2 is connected to the gate electrode G2 of the second thin film transistor TR2 through a fourth contact hole H4, and is connected to the first capacitor electrode C11 of the first capacitor C1 through a seventh contact hole H7.

Also, referring to FIG. 15, a third bridge BR3 is disposed on the interlayer insulating layer 180. The third bridge BR3 is connected to the gate line GL through an eighth contact hole H8 and thus connected to the first gate electrode G1, and is connected to the light shielding layer 111 of the first thin film transistor TR1 through a ninth contact hole H9. Although FIG. 15 illustrates that the light shielding layer 111 is connected to the first gate electrode G1, one embodiment of the present disclosure is not limited thereto, and the light shielding layer 111 may be also connected to the first source electrode S1 or the first drain electrode D1.

A planarization layer 175 is disposed on the data line DL, the driving power line PL, the second capacitor electrode C12, the first bridge BR1, the second bridge BR2 and the third bridge BR3. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 is in contact with the second capacitor electrode C12 integrally formed with the first bridge BR1, through a sixth contact hole H6 formed in the planarization layer 175. As a result, the first electrode 711 may be connected to the second source electrode S2 of the second thin film transistor TR2.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 16 is an organic light emitting diode (OLED). Therefore, the display device 900 according to one embodiment of the present disclosure is an organic light emitting display device.

According to another embodiment of the present disclosure, the second thin film transistor TR2 may have a large s-factor. The second thin film transistor TR2 may be used as a driving transistor to improve a gray representation capability of the display device 900.

Figure 17:
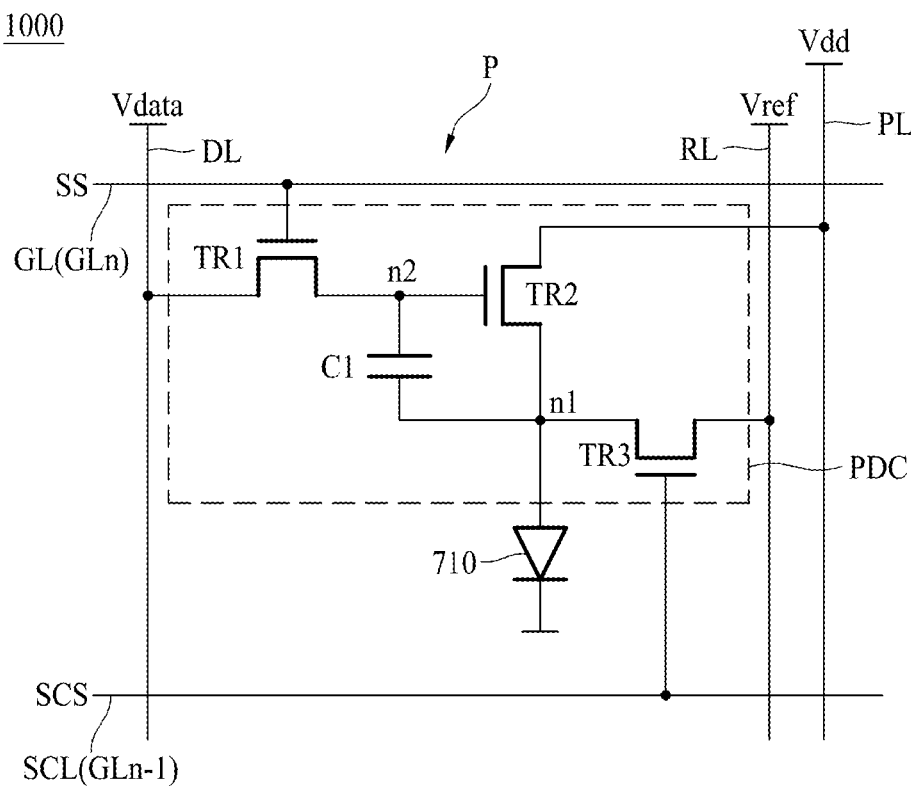
FIG. 17 is a circuit diagram illustrating any one pixel of a display device according to still another embodiment of the present disclosure.

FIG. 17 is a circuit diagram illustrating any one pixel P of a display device 1000 according to still another embodiment of the present disclosure.

FIG. 17 is an equivalent circuit diagram illustrating a pixel P of an organic light emitting display device.

The pixel P of the display device 1000 shown in FIG. 17 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 17, assuming that a gate line of an (n)th pixel P is "$GL_n$", a gate line of a (n–1)th pixel P adjacent to the (n)th pixel P is "$GL_{n-1}$", and the gate line "$GL_{n-1}$" of the (n–1)th pixel P serves as a sensing control line SCL of the (n)th pixel P.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is positioned between the gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 18:
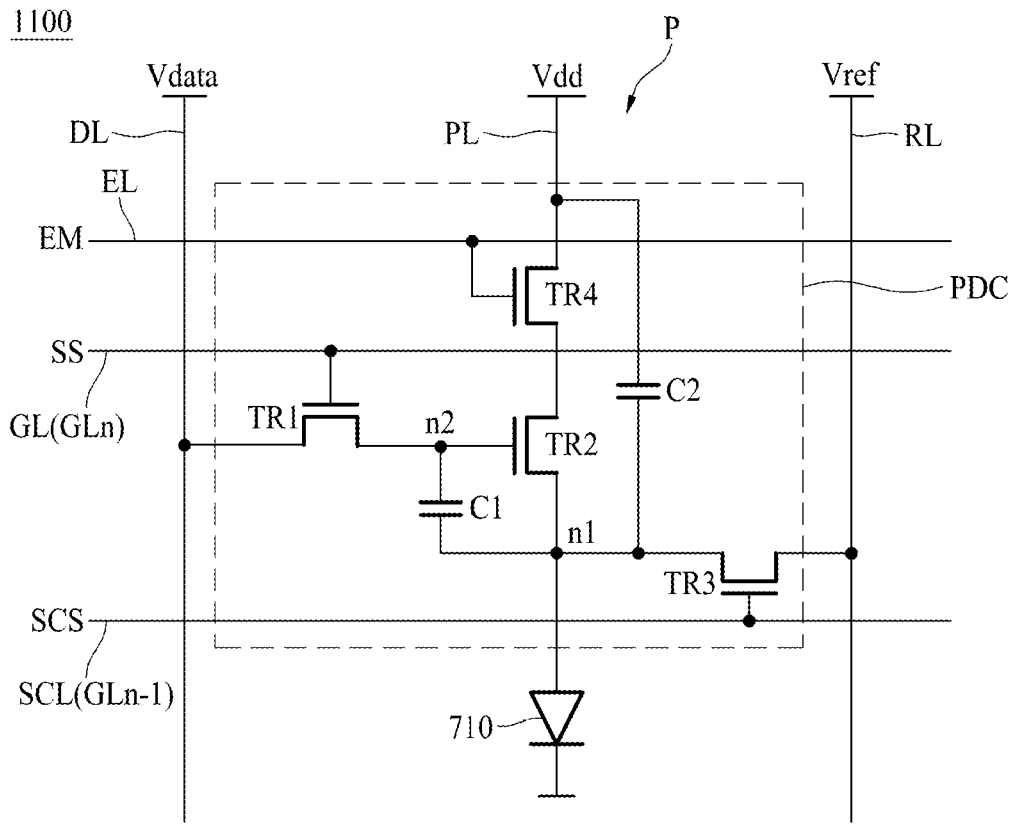
FIG. 18 is a circuit diagram illustrating any one pixel of a display device according to further still another embodiment of the present disclosure.

FIG. 18 is a circuit diagram illustrating a pixel of a display device 1100 according to further still another embodiment of the present disclosure.

The pixel P of the display device 1100 shown in FIG. 18 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 17, the pixel P of FIG. 18 further includes an emission control line EL. An emission control signal EM is supplied to the emission control line EL.

Also, the pixel driving circuit PDC of FIG. 18 further includes a fourth thin film transistor TR4 that is an emission control transistor for controlling a light emission timing of the second thin film transistor TR2, in comparison with the pixel driving circuit PDC of FIG. 17.

Referring to FIG. 18, assuming that a gate line of an (n)th pixel P is "$GL_n$", a gate line of a (n–1)th pixel P adjacent to the (n)th pixel P is "$GL_{n-1}$", and the gate line "$GL_{n-1}$" of the (n–1)th pixel P serves as a sensing control line SCL of the (n)th pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

According to the present disclosure, the following advantageous effects may be obtained.

The thin film transistor according to one embodiment of the present disclosure has a large s-factor, and at the same time has excellent ON-current characteristics. Therefore, when the thin film transistor is used, a gray scale representation capability of the display device may be improved, and current characteristics of the display device may be also improved.

Further examples are set out in the numbered clauses below:

1. A thin film transistor comprising: an active layer; and a gate electrode at least partially overlapped with the active layer, wherein the active layer includes: a channel portion; a first connection portion that is in contact with one side of the channel portion; and a second connection portion that is in contact with the other side of the channel portion, the channel portion includes a first area and a second area that is disposed in parallel with the first area, each of the first area and the second area is extended from the first connection portion to the second connection portion, and an effective gate voltage applied to the first area is smaller than that applied to the second area.

2. The thin film transistor of clause 1, wherein the channel portion includes a third area spaced apart from the first area with the second area interposed therebetween, the third area is extended from at least the first connection portion to the second connection portion, and an effective gate voltage applied to the third area is smaller than that applied to the second area.

3. The thin film transistor of clause 1 or clause 2, wherein the channel portion includes a fourth area spaced apart from the second area with the first area interposed therebetween, the fourth area is extended from at least the first connection portion to the second connection portion, and an effective gate voltage applied to the fourth area is greater than that applied to the first area.

4. The thin film transistor of any one of clauses 1-3, further comprising a first conductive material layer overlapped with the channel portion, wherein the channel portion is disposed between the first conductive material layer and the gate electrode, and the first conductive material layer is connected to the first connection portion.

5. The thin film transistor of clause 4, wherein the first conductive material layer overlaps the first area.

6. The thin film transistor of clause 4 or 5, further comprising a first spacer overlapped with the channel portion.

7. The thin film transistor of clause 6, wherein the first spacer does not overlap the first area, and overlaps the second area.

8. The thin film transistor of clause 6 or clause 7, wherein the channel portion further includes a third area spaced apart from the first area so as not to overlap the first spacer.

9. The thin film transistor of any of clauses 6-8, wherein the first spacer is disposed between the channel portion and the first conductive material layer.

10. The thin film transistor of any of clauses 6-9, wherein the first spacer and the first conductive material layer are disposed on the same layer.

11. The thin film transistor of any of clauses 6-10, further comprising a second spacer spaced apart from the first spacer to overlap the channel portion.

12. The thin film transistor of clause 11, wherein the channel portion includes a fourth area overlapped with the second spacer.

13. The thin film transistor of clause 11 or 12, wherein the first area overlaps a gap space between the first spacer and the second spacer.

14. The thin film transistor of any one of clauses 11-13, wherein the first spacer and the second spacer are disposed between the channel portion and the first conductive material layer.

15. The thin film transistor of any one of clauses 11-14, wherein the first conductive material layer, the first spacer and the second spacer are disposed on the same layer, and the first conductive material layer is disposed between the first spacer and the second spacer.

16. The thin film transistor of clause 4, further comprising a second conductive material layer spaced apart from the first conductive material layer to overlap the channel portion, wherein the channel portion is disposed between the second conductive material layer and the gate electrode, and the second conductive material layer is connected to the first connection portion.

17. The thin film transistor of clause 16, wherein the channel portion includes a third area overlapped with the second conductive material layer.

18. The thin film transistor of clause 16 or 17, further comprising a first spacer between the first conductive material layer and the second conductive material layer.

19. The thin film transistor of clause 18, wherein the first conductive material layer, the second conductive material layer and the first spacer are disposed on the same layer.

20. The thin film transistor of clause 16, wherein the second area overlaps a gap space between the first conductive material layer and the second conductive material layer.

21. The thin film transistor of clause 4, further comprising a conductive pattern spaced apart from the active layer with the first conductive material layer interposed therebetween.

22. The thin film transistor of clause 16, further comprising a conductive pattern spaced apart from the active layer with the first conductive material layer and the second conductive material layer, which are interposed therebetween.

23. The thin film transistor of any one of clauses 1-22, wherein the active layer includes an oxide semiconductor material.

24. The thin film transistor of clause 23, wherein the oxide semiconductor material includes at least one of an IZO (InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based or FIZO(FeInZnO)-based oxide semiconductor material.

25. The thin film transistor of any one of clauses 1-24, wherein the active layer includes:

a first oxide semiconductor layer; and a second oxide semiconductor layer on the first oxide semiconductor layer.

26. The thin film transistor of clause 25, wherein the active layer further includes a third oxide semiconductor layer on the second oxide semiconductor layer.

27. A display device comprising the thin film transistor of any one of clauses 1 to 26.

28. A thin film transistor comprising: an active layer; and a gate electrode at least partially overlapped by a portion of the active layer, wherein the active layer includes: a channel portion; a first connection portion that is in contact with one side of the channel portion; and a second connection portion that is in contact with the other side of the channel portion, wherein the channel portion includes a first area and a second area, each of the first area and the second area extend from the first connection portion to the second connection portion, and wherein each of the first area and the second area extend from the first connection portion to the second connection portion, further comprising a first conductive material layer overlapped by the channel portion, wherein the channel portion is disposed between the first conductive material layer and the gate electrode, and the first conductive material layer is connected to the first connection portion; further comprising a first spacer overlapped by the channel portion.

29. A thin film transistor comprising:

an active layer; and a gate electrode at least partially overlapped by a portion of the active layer, wherein the active layer includes: a channel portion;

a first connection portion that is in contact with one side of the channel portion; and a second connection portion that is in contact with the other side of the channel portion, wherein the channel portion includes a first area and a second area, each of the first area and the second area extend from the first connection portion to the second connection portion, and wherein each of the first area and the second area extend from the first connection portion to the second connection portion, further comprising a first conductive material layer overlapped by the channel portion, wherein the channel portion is disposed between the first conductive material layer and the gate electrode, and the first conductive material layer is connected to the first connection portion, further comprising a second conductive material layer spaced apart from the first conductive material layer to overlap the channel portion, wherein the channel portion is disposed between the second conductive material layer and the gate electrode, and the second conductive material layer is connected to the first connection portion.

It will be apparent to those skilled in the art that the present disclosure described above is not limited by the above-described embodiments and the accompanying drawings and that various substitutions, modifications and variations can be made in the present disclosure without departing from the scope of the disclosures. Consequently, the scope of the present disclosure is intended to cover all variations or modifications derived from the meaning, scope and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor, comprising:

an active layer including:

a channel portion;

a first connection portion that is in contact with one side of the channel portion; and a second connection portion that is in contact with the other side of the channel portion;

a gate electrode at least partially overlapped by a portion of the active layer;

a first conductive material layer overlapped by the channel portion; and a first spacer overlapped by the channel portion, wherein the channel portion includes a first area and a second area, each of the first area and the second area extend from the first connection portion to the second connection portion, wherein the channel portion is disposed between the first conductive material layer and the gate electrode, wherein the first conductive material layer is coupled to the first connection portion, wherein the first spacer does not overlap the first area, and overlaps the second area, and wherein the first spacer is disposed between the channel portion and the first conductive material layer.

2. The thin film transistor of claim 1, wherein the channel portion includes a third area spaced apart from the first area with the second area interposed therebetween, in which the third area extends from at least the first connection portion to the second connection portion.

3. The thin film transistor of claim 1, wherein the channel portion includes a fourth area spaced apart from the second area with the first area interposed therebetween, in which the fourth area extends from at least the first connection portion to the second connection portion.

4. The thin film transistor of claim 1, wherein the first conductive material layer overlaps the first area.

5. The thin film transistor of claim 1, wherein the channel portion further includes a third area spaced apart from the first area and do not overlap the first spacer.

6. The thin film transistor of claim 1, wherein the first spacer is disposed between the channel portion and the first conductive material layer.

7. The thin film transistor of claim 1, wherein the first spacer and the first conductive material layer are disposed on a same layer.

8. The thin film transistor of claim 1, further comprising a second spacer spaced apart from the first spacer to overlap the channel portion.

9. The thin film transistor of claim 8, wherein the channel portion includes a fourth area overlapped by the second spacer.

10. The thin film transistor of claim 8, wherein the first area overlaps a gap space between the first spacer and the second spacer.

11. The thin film transistor of any one of claim 8, wherein the first spacer and the second spacer are disposed between the channel portion and the first conductive material layer.

12. The thin film transistor of any one of claim 8, wherein the first conductive material layer, the first spacer and the second spacer are disposed on a same layer, and wherein the first conductive material layer is disposed between the first spacer and the second spacer.

13. The thin film transistor of claim 1, further comprising a conductive pattern spaced apart from the active layer with the first conductive material layer interposed therebetween.

14. The thin film transistor of claim 1, wherein the active layer includes an oxide semiconductor material.

15. The thin film transistor of claim 14, wherein the oxide semiconductor material includes at least one of an IZO (InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(In-SnZnO)-based or FIZO(FeInZnO)-based oxide semiconductor material.

16. The thin film transistor of claim 1, wherein the active layer includes:

a first oxide semiconductor layer; and a second oxide semiconductor layer on the first oxide semiconductor layer.

17. The thin film transistor of claim 16, wherein the active layer further includes a third oxide semiconductor layer on the second oxide semiconductor layer.

18. A thin film transistor, comprising:

an active layer including:

a channel portion;

a first connection portion that is in contact with one side of the channel portion; and a second connection portion that is in contact with the other side of the channel portion;

a gate electrode at least partially overlapped by a portion of the active layer;

a first conductive material layer overlapped by the channel portion;

a second conductive material layer spaced apart from the first conductive material layer to overlap the channel portion, and a first spacer between the first conductive material layer and the second conductive material layer wherein the channel portion includes a first area and a second area, wherein each of the first area and the second area extend from the first connection portion to the second connection portion, wherein the channel portion is disposed between the first conductive material layer and the gate electrode, wherein the first conductive material layer is coupled to the first connection portion, wherein the channel portion is disposed between the second conductive material layer and the gate electrode, wherein the second conductive material layer is coupled to the first connection portion, wherein the channel portion is integrally formed, and wherein the first conductive material layer, the second conductive material layer, and the first spacer are disposed on a same layer.

19. The thin film transistor of claim 18, wherein the channel portion includes a third area overlapped by the second conductive material layer.

20. The thin film transistor of claim 18, wherein the second area overlaps a gap space between the first conductive material layer and the second conductive material layer.

21. The thin film transistor of claim 18, further comprising a conductive pattern spaced apart from the active layer by the first conductive material layer and the second conductive material layer, which are both interposed therebetween.

22. A display device, comprising:

a thin film transistor including an active layer, a gate electrode, a first conductive material layer, and a first spacer, wherein the active layer includes:

a channel portion;

a first connection portion that is in contact with one side of the channel portion; and a second connection portion that is in contact with the other side of the channel portion, wherein the gate electrode is at least partially overlapped by a portion of the active layer, wherein the first conductive material layer is overlapped by the channel portion, wherein the first spacer is overlapped by the channel portion, wherein the channel portion includes a first area and a second area, wherein each of the first area and the second area extend from the first connection portion to the second connection portion, wherein the channel portion is disposed between the first conductive material layer and the gate electrode, wherein the first conductive material layer is coupled to the first connection portion, wherein the first spacer does not overlap the first area, and overlaps the second area, and wherein the first spacer is disposed between the channel portion and the first conductive material layer.

* * * * *